(12) United States Patent
Xu et al.

(10) Patent No.: US 11,569,472 B2
(45) Date of Patent: Jan. 31, 2023

(54) ELECTROLUMINESCENT DISPLAY SUBSTRATE, MANUFACTURING METHOD THEREOF AND ELECTROLUMINESCENT DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yingsong Xu, Beijing (CN); Benlian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 234 days.

(21) Appl. No.: 17/081,429

(22) Filed: Oct. 27, 2020

(65) Prior Publication Data
US 2021/0159446 A1    May 27, 2021

(30) Foreign Application Priority Data
Nov. 26, 2019    (CN) .......................... 201911179325.X

(51) Int. Cl.
*H01L 51/52*    (2006.01)
*G09G 3/3208*    (2016.01)
(Continued)

(52) U.S. Cl.
CPC ....... *H01L 51/5237* (2013.01); *G09G 3/3208* (2013.01); *H01L 21/3213* (2013.01);
(Continued)

(58) Field of Classification Search
CPC ... H01L 27/30; H01L 27/3239; H01L 31/162; H01L 33/08; H01L 33/18; H01L 33/24;
(Continued)

(56) References Cited

U.S. PATENT DOCUMENTS 10,629,662 B2    4/2020 Ding et al.
10,978,526 B2    4/2021 Qin et al.
(Continued)

FOREIGN PATENT DOCUMENTS

CN    107452894 A    12/2017
CN    108666347 A    10/2018
(Continued)

OTHER PUBLICATIONS

First Chinese Office Action dated Sep. 24, 2021, received for corresponding Chinese Application No. 201911179325.X, 37 pages.

*Primary Examiner* — Moin M Rahman
(74) *Attorney, Agent, or Firm* — Kinney & Lange, P.A.

(57) ABSTRACT

An electroluminescent display substrate and a manufacturing method thereof, and an electroluminescent display apparatus, are disclosed. The display substrate includes: a base substrate; an electroluminescent element on the base substrate, the electroluminescent element including a first electrode layer, a light-emitting layer and a second electrode layer which are disposed in sequence on the base substrate; an encapsulating layer disposed on the base substrate and covering the electroluminescent element; an aperture, the aperture at least penetrating the encapsulating layer; and at least one eave structure on the base substrate, the at least one eave structure surrounding the aperture, and being located between the aperture and the electroluminescent element. Each eave structure includes at least one undercut at one end of the eave structure close to the base substrate, and at least
(Continued)

one of the light-emitting layer and the second electrode layer is disconnected at the at least one undercut.

20 Claims, 14 Drawing Sheets

(51) Int. Cl.
*H01L 21/3213* (2006.01)
*H01L 27/32* (2006.01)
*H01L 29/43* (2006.01)

(52) U.S. Cl.
CPC ...... *H01L 27/3246* (2013.01); *H01L 27/3276* (2013.01); *H01L 29/43* (2013.01); *H01L 51/5221* (2013.01)

(58) Field of Classification Search
CPC . H01L 51/5032; H01L 25/048; H01L 27/288; H01L 27/32; H01L 31/143; H01L 33/04; H01L 33/06; H01L 33/26; H01L 51/0032; H01L 51/50; H01L 2251/50; H01L 51/5068; H01L 51/5084; H01L 51/5296; H01L 2051/0032; H01L 2227/32; H01L 33/52–56; H01L 51/5253–5256; H01L 51/448; H01L 51/5209; H01L 27/3262; H01L 27/3248; H01L 2251/303; H01L 2251/306; H01L 2251/308; H01L 51/5218; H01L 51/5271; H01L 51/5275; H01L 51/5225; H01L 27/3258; H01L 27/322; H01L 51/0005; H01L 51/5012; H01L 51/5206; H01L 51/5221; H01L 51/56; H01L 51/5268; H01L 2251/558; H01L 27/3244; H01L 2227/323; H01L 33/382; H01L 33/387; H01L 33/504; H01L 33/507; H01L 25/0753; H01L 27/156; H01L 33/56; H01L 33/62; H01L 2224/48091; H01L 2224/48137; H01L 33/647; H01L 33/486; H01L 2224/45144; H01L 33/54; H01L 33/641; H01L 33/60; H01L 25/167; H01L 27/153; H01L 27/3202; H01L 27/3204; H01L 27/3209; H01L 27/3225; H01L 27/3251; H01L 51/525; H01L 51/5287; H01L 2227/326; H01L 2251/5323; H01L 2251/5338; H01L 2251/5353; H01L 2251/56; H01L 2251/566; H01L 29/12041; H01L 29/12044; H01L 51/0508–057; H01L 51/105; H01L 51/055–0554; H01L 51/0541; H01L 51/0545; H01L 27/283; H01L 27/3274

See application file for complete search history.

(56) References Cited

U.S. PATENT DOCUMENTS

| | | | |
|---|---|---|---|
| 11,094,914 B2 | 8/2021 | Huang et al. | |
| 2006/0119259 A1 | 6/2006 | Bae et al. | |
| 2018/0097047 A1* | 4/2018 | Jung | H01L 51/5228 |
| 2018/0122836 A1* | 5/2018 | Kang | H01L 33/54 |
| 2019/0237703 A1 | 8/2019 | Kim et al. | |
| 2021/0043872 A1 | 2/2021 | Gao | |
| 2021/0359235 A1 | 11/2021 | Jiang | |

FOREIGN PATENT DOCUMENTS

| | | |
|---|---|---|
| CN | 109768188 A | 5/2019 |
| CN | 109801956 A | 5/2019 |
| CN | 110120464 A | 8/2019 |
| CN | 110212118 A | 9/2019 |
| CN | 110429207 A | 11/2019 |
| CN | 110491913 A | 11/2019 |

* cited by examiner

ELECTROLUMINESCENT DISPLAY SUBSTRATE, MANUFACTURING METHOD THEREOF AND ELECTROLUMINESCENT DISPLAY APPARATUS

CROSS-REFERENCE TO RELATED APPLICATION

This application claims the benefit of Chinese Patent Application No. 201911179325.X filed on Nov. 26, 2019 in the National Intellectual Property Administration of China, the whole disclosure of which is incorporated herein by reference.

TECHNICAL FIELD

The present disclosure relates to the field of display technologies, and in particular, to an electroluminescent display substrate, a manufacturing method thereof, and an electroluminescent display apparatus.

BACKGROUND

In recent years, with the advancement of science and technology, special-shaped screens and full-screens have gradually come into our vision. Not only the special-shaped screens but also the full screens are intended to increase a screen ratio of a display apparatus. Thus, to achieve a higher screen ratio, some opening regions (for example, apertures) are needed to be reserved in some positions on the display screen for some additional elements (for example, cameras, sensors, etc.).

An electroluminescent display apparatus such as an OLED display apparatus generally comprises an OLED element sensitive to water and oxygen. An organic light-emitting layer and a cathode layer which are both formed through evaporation would form an invasion path through which the aperture is in communication with the OLED element, thereby causing water and oxygen invading into an interior of OLED element from a side surface of the aperture and along the invasion path. As a result, the performance and the service life of the OLED element may be adversely affected. Thus, the focus of research and development personnel researching the display apparatus of this kind is to increase the encapsulation dependence of the display apparatus providing with apertures.

SUMMARY

In an aspect, an electroluminescent display substrate is provided, comprising: a base substrate; an electroluminescent element on the base substrate, the electroluminescent element comprising a first electrode layer, a light-emitting layer and a second electrode layer which are disposed on the base substrate in sequence; an encapsulating layer disposed on the base substrate and covering the electroluminescent element; an aperture, the aperture at least penetrating the encapsulating layer; and at least one eave structure on the base substrate, the at least one eave structure surrounding the aperture and being located between the aperture and the electroluminescent element, wherein each eave structure comprises at least one undercut at one end of the eave structure close to the base substrate, and at least one of the light-emitting layer and the second electrode layer is disconnected at the at least one undercut.

According to some exemplary embodiments of the present disclosure, each eave structure comprises a first side close to the aperture and a second side away from the aperture, the at least one undercut comprises at least one of a first undercut in the first side and a second undercut in the second side.

According to some exemplary embodiments of the present disclosure, the at least one eave structure comprises a plurality of eave structures disposed at intervals.

According to some exemplary embodiments of the present disclosure, both the light-emitting layer and the second electrode layer are disconnected at the at least one undercut.

According to some exemplary embodiments of the present disclosure, the first undercut extends from the first side towards the second side, a wall of the first undercut away from the aperture constitutes a third side of the eave structure providing with the first undercut, the first side protrudes relative to the third side in a direction from the electroluminescent element to the aperture, so that at least one of the light-emitting layer and the second electrode layer is disconnected at the first undercut.

According to some exemplary embodiments of the present disclosure, the second undercut extends from the second side towards the first side, a wall of the second undercut close to the aperture constitutes a fourth side of the eave structure providing with the second undercut, the second side protrudes relative to the fourth side in a direction from the aperture to the electroluminescent element, so that at least one of the light-emitting layer and the second electrode layer is disconnected at the second undercut.

According to some exemplary embodiments of the present disclosure, the at least one eave structure comprises a first eave structure and a second eave structure, the first eave structure and the second eave structure are disposed in sequence in a direction from the aperture to the electroluminescent element, the first eave structure comprises a second undercut on the second side of the first eave structure, the second eave structure comprises a first undercut on the first side of the second eave structure, and at least one of the light-emitting layer and the second electrode layer is disconnected at both the second undercut of the first eave structure and the first undercut of the second eave structure.

According to some exemplary embodiments of the present disclosure, the at least one eave structure comprises a first eave structure, a second eave structure, a third eave structure and a fourth eave structure, the first eave structure, the second eave structure, the third eave structure and the fourth eave structure are disposed in sequence in a direction from the aperture to the electroluminescent element, the first eave structure comprises a second undercut on the second side of the first eave structure, the second eave structure comprises a first undercut on the first side of the second eave structure and a second undercut on the second side of the second eave structure, the third eave structure comprises a first undercut on the first side of the third eave structure and a second undercut on the second side of the third eave structure, the fourth eave structure comprises a first undercut in the first side of the fourth eave structure, and at least one of the light-emitting layer and the second electrode layer is disconnected at all of the second undercut of the first eave structure, the first undercut and the second undercut of the second eave structure, the first undercut and the second undercut of the third eave structure, and the first undercut of the fourth eave structure.

According to some exemplary embodiments of the present disclosure, the at least one eave structure comprises a first eave structure and a second eave structure, the first eave structure and the second eave structure are disposed in sequence in a direction from the aperture to the electroluminescent element, the first eave structure comprises a first undercut on the first side of the first eave structure, the second eave structure comprises a first undercut on the first side of the second eave structure, and at least one of the light-emitting layer and the second electrode layer is disconnected at both the first undercut of the first eave structure and the first undercut of the second eave structure.

According to some exemplary embodiments of the present disclosure, the at least one eave structure comprises a first eave structure and a second eave structure, the first eave structure and the second eave structure are disposed in sequence in a direction from the aperture to the electroluminescent element, the first eave structure comprises a second undercut on the second side of the first eave structure, the second eave structure comprises a second undercut on the second side of the second eave structure, and at least one of the light-emitting layer and the second electrode layer is disconnected at both the second undercut of the first eave structure and the second undercut of the second eave structure.

According to some exemplary embodiments of the present disclosure, the electroluminescent display substrate further comprises: at least one positioning structure on the base substrate, the at least one positioning structure surrounding the aperture and being located between the aperture and the at least one eave structure, wherein the positioning structure and the first electrode layer are on the same layer.

According to some exemplary embodiments of the present disclosure, the electroluminescent display substrate further comprises a pixel define layer, wherein the at least one eave structure and the pixel define layer are on the same layer.

According to some exemplary embodiments of the present disclosure, a height of the at least one undercut in a direction perpendicular to the base substrate is larger than a thickness of the first electrode layer in the direction perpendicular to the base substrate.

According to some exemplary embodiments of the present disclosure, the encapsulating layer comprises a first encapsulating sub-layer, a second encapsulating sub-layer and a third encapsulating sub-layer provided in sequence in a direction away from the base substrate, the first encapsulating sub-layer and the third encapsulating sub-layer are made of inorganic material, the second encapsulating sub-layer is made of organic material, and the first encapsulating sub-layer and the third encapsulating sub-layer cover all sides of each eave structure and the positioning structure.

According to some exemplary embodiments of the present disclosure, the electroluminescent display substrate further comprises: a first planarization layer on a side of the third encapsulating sub-layer away from the base substrate, wherein the first planarization layer fills the at least one undercut and the intervals between any two ones of the plurality of eave structures.

In another aspect, an electroluminescent display apparatus is provided, comprising the electroluminescent display substrate as described above.

In another further aspect, a method of manufacturing an electroluminescent display substrate is provided, comprising: forming a first electrode layer on a base substrate; forming at least one placeholder structure on the base substrate; forming a pixel define material layer on the base substrate, and forming a structure covering at least one side of each placeholder structure through a patterning process; etching off the placeholder structure through a wet-etching process, so that the structure covering at least one side of each placeholder structure forms an eave structure, the eave structure comprising at least one undercut at one end of the eave structure close to the base substrate; forming a light-emitting layer and a second electrode layer on the base substrate through an evaporation process, so that at least one of the light-emitting layer and the second electrode layer is disconnected at the at least one undercut; forming an encapsulating layer on a side of the second electrode layer away from the base substrate; and forming an aperture in an area surrounded by the eave structure, the aperture at least penetrating the encapsulating layer.

According to some exemplary embodiments of the present disclosure, an etching solution used in the wet-etching process has different etching rates between a material of the placeholder structure and a material of the first electrode layer.

According to some exemplary embodiments of the present disclosure, the material of the placeholder structure comprises IZO or IGZO, and the material of the first electrode layer comprises ITO.

According to some exemplary embodiments of the present disclosure, the step of forming the first electrode layer on the base substrate comprises: through the same one patterning process, forming the first electrode layer and at least one positioning structure on the base substrate, the at least one positioning structure surrounding an area in which the aperture is to be formed.

BRIEF DESCRIPTION OF THE DRAWINGS

To better illustrate technical solutions of embodiments of the present disclosure, accompanying drawings of the embodiments will be briefly described below, it should be noted that the drawings described below only relate to some embodiments of the present disclosure, and do not limit the present disclosure, wherein.

Figure 1:
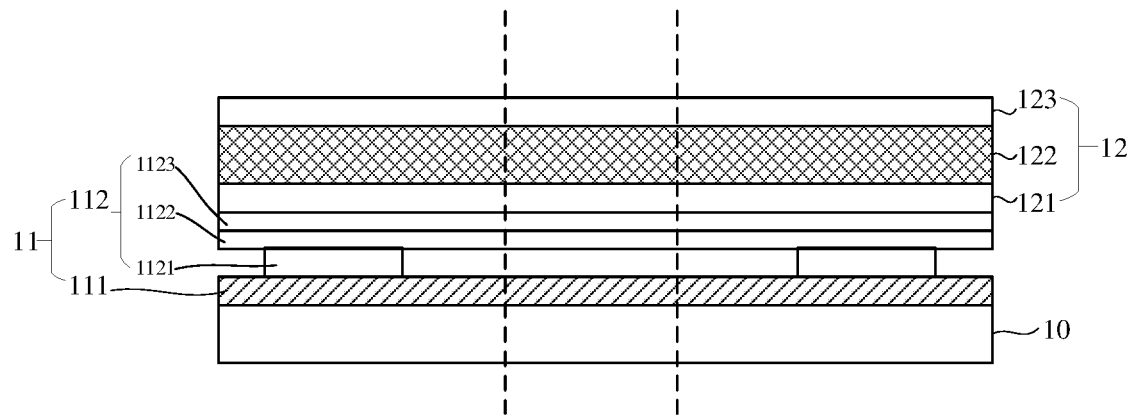
FIG. 1 is a schematic sectional view of an electroluminescent display apparatus.

It should be noted that, for clarity, in the drawings for describing the embodiments of the present disclosure, dimensions of layers, structures or regions may be enlarged or reduced, that is to say that these drawings are not drawn in actual scales.

DETAILED DESCRIPTION OF EMBODIMENTS

The technical solutions of the present disclosure will be further described below through embodiments with reference to the drawings. In the specification, the same or similar reference numerals indicate the same or similar elements. The following description to the embodiments of the present disclosure with reference to the drawings is intended to explain the general inventive concept of the present disclosure, and should not be understood as a limitation to the present disclosure.

Moreover, for the convenience of explanation, in the detailed description below, many specific details are described so as to provide a comprehensive understanding of the embodiments of the present disclosure. However, it is clear that one or more embodiments may also be implemented without these specific details.

It should be noted that, expressions such as "on", "formed on" and "disposed on" described in the context may mean that one layer is formed or disposed on another layer directly, or may mean that a layer is formed or disposed on another layer indirectly, that is, there are other layers between the two layers.

It should be noted that although terms "first", "second", etc. may be used herein to describe various components, members, elements, regions, layers and/or parts, however, these components, members, elements, regions, and layers and/or parts should not be limited by these terms. Rather, these terms are used to distinguish one component, member, element, region, layer, and/or part from another. Thus, for example, the first component, the first member, the first element, the first region, the first layer, and/or the first part discussed below may be referred to as the second part, the second member, the second element, the second region, the second layer and/or the second part without departing from the teachings of the present disclosure.

In the context, unless otherwise specified, the term "the same layer" used herein means that two layers, components, members, elements or parts may be formed through the same one patterning process, and, these two layers, components, members, elements or parts are generally formed of the same material.

In the context, unless otherwise specified, the expression "patterning process" generally comprises steps of photoresist coating, exposure, development, etching, and photoresist stripping, etc. The expression "one patterning process" means that a process of forming patterned layers, components, members, or the like by using one mask.

In the context, for the convenience of description, directional terms such as "X direction" and "Y direction" are used to indicate relative positional relationships between components, however, those skilled in the art should understand that these directional terms are only exemplary specifications for the orientations shown in the drawings, when the absolute orientation of the drawings changes, the relative positional relationships between the components may change correspondingly.

In the context, unless otherwise specified, the expression "disconnected" means that two components, elements or parts are not continuously extended, specifically, an end point, an end portion or an end surface of one part, element or part close to another part, element or part does not contact with an end point, an end portion or an end surface of another part, element or part close to the one part, element or part.

As shown in FIG. 1, an electroluminescent display apparatus such as an OLED display comprises: a base substrate 10, a display light-emitting element 11 on the base substrate 10, and an encapsulating layer 12 covering the display light-emitting element 11. Wherein, the display light-emitting element 11 may comprise a wiring layer 111 and an OLED element 112 on the wiring layer 111. For example, the wiring layer 111 may comprise various circuits, conductive traces and the like, for driving the display light-emitting element. The OLED element 112 may comprise an anode layer 1121, a cathode layer 1123 and a light-emitting layer 1122 between the anode layer 1121 and the cathode layer 1123. For example, the light-emitting layer 1122 may be an organic light-emitting layer. Generally, the light-emitting layer 1122 and the cathode layer 1123 are formed through an evaporation process, that is, each of the light-emitting 1122 and the cathode layer 1123 extends continuously, as shown in FIG. 1.

For example, the encapsulating layer 12 may comprise film layers formed alternatively by inorganic layers and organic layers. For example, the encapsulating layer may comprise a first encapsulating sub-layer 121, a second encapsulating sub-layer 122 and a third encapsulating sub-layer 123 which are disposed in sequence. For example, the first encapsulating sub-layer 121 and the third encapsulating sub-layer 123 may be made of inorganic material, and the second encapsulating sub-layer 122 may be made of organic material.

Figure 2:
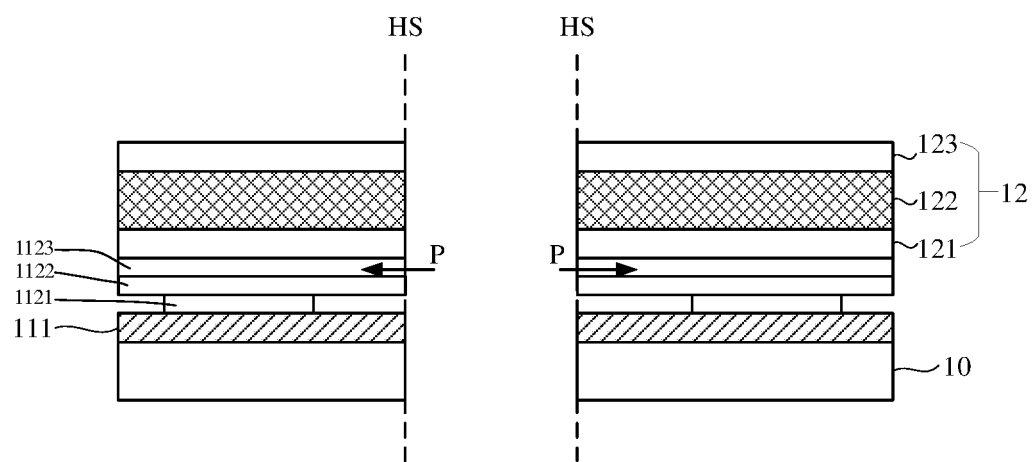
FIG. 2 is a schematic sectional view of a structure of the display apparatus in FIG. 1 after an aperture is formed.

To increase the screen ratio of a display, the research and development personnel has focused on the full-screens. For this type of display, apertures are required to be formed on the display screen, for example, apertures are formed at positions of two dotted lines in FIG. 1, so that the structure shown in FIG. 2 is obtained. In this way, hardware mounting positions for front cameras, Home key and the like are reserved on the terminal device.

However, the OLED element is sensitive to water vapor and oxygen, water vapor and oxygen invading into the interior of the element is the main factor affecting the service life of the OLED element, thus, encapsulation is vital to the OLED element. With reference to FIG. 2, as the light-emitting layer 1122 and the cathode layer 1123 are continuously extended layers formed through an evaporation process, there is an invasion path through which the aperture is in communication with the OLED element 112 in the display apparatus shown in FIG. 2, as indicated by P in FIG. 2. For a display apparatus providing with an aperture, water vapor and oxygen are prone to invading into the interior of the OLED element 112 from a cutting surface HS of the aperture along the invasion path P, as indicated by the arrow in FIG. 2, that is, invading directly into a display region of the display light-emitting element, thereby causing the failure of the encapsulation of the OLED display. As a result, the display effect of the OLED display is adversely affected and the service life of the OLED display is significantly reduced.

Figure 3:
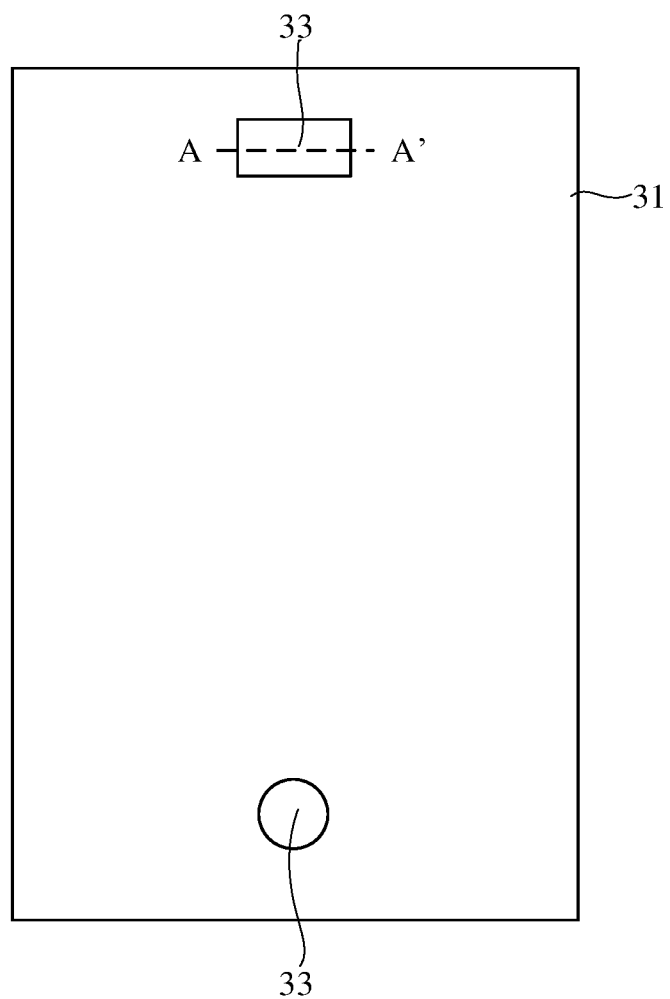
FIG. 3 is a plan view of an electroluminescent display substrate according to some exemplary embodiments of the present disclosure.
Figure 4A:
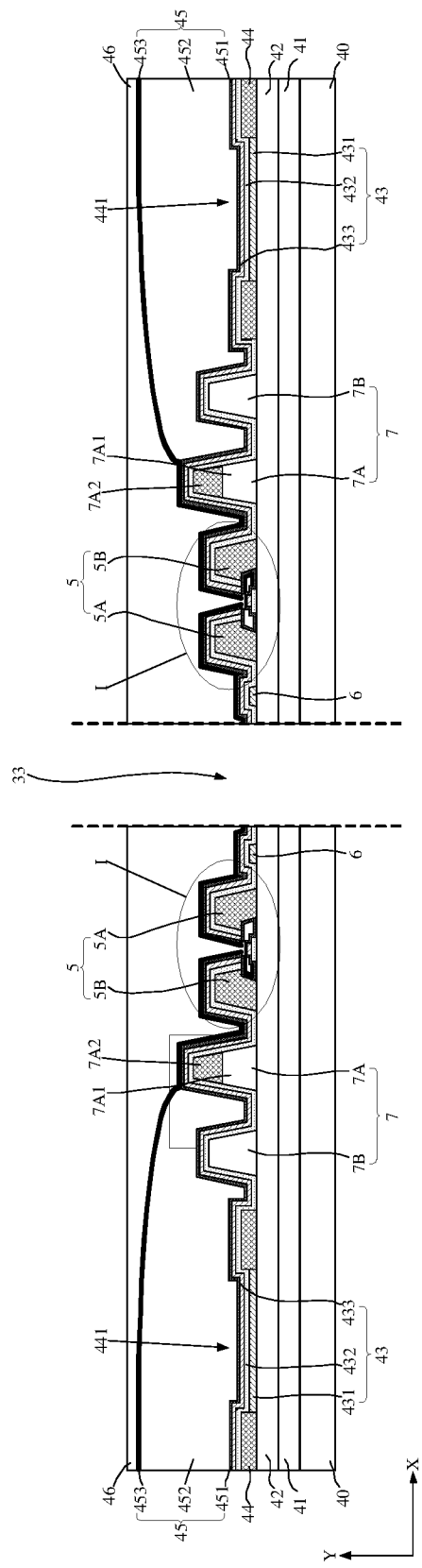
FIG. 4A is a schematic sectional view of the electroluminescent display substrate according to the exemplary embodiments of the present disclosure taken along line A-A' in FIG. 3.
Figure 4B:
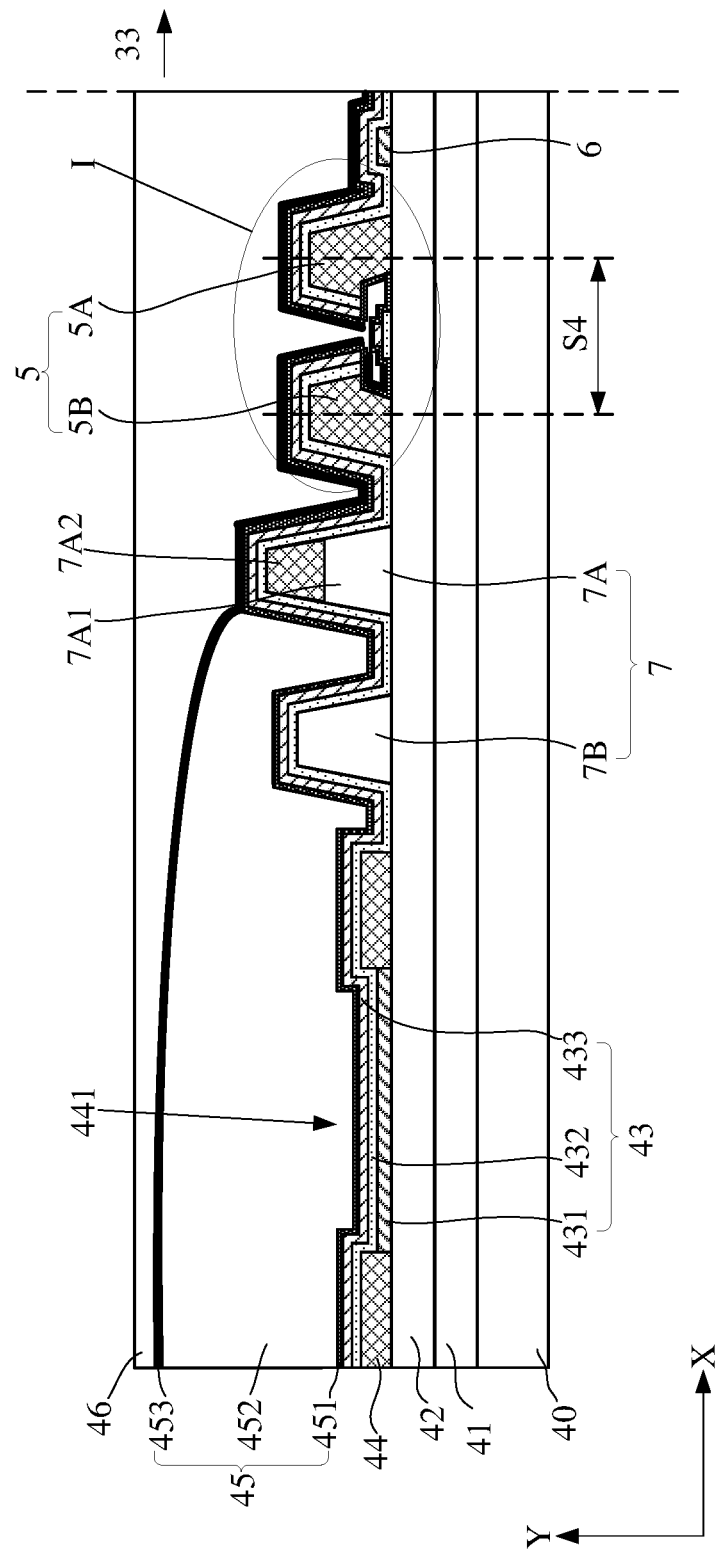
FIG. 4B is a partial sectional view of the electroluminescent display substrate in FIG. 4A on one side of the aperture.
Figure 4C:
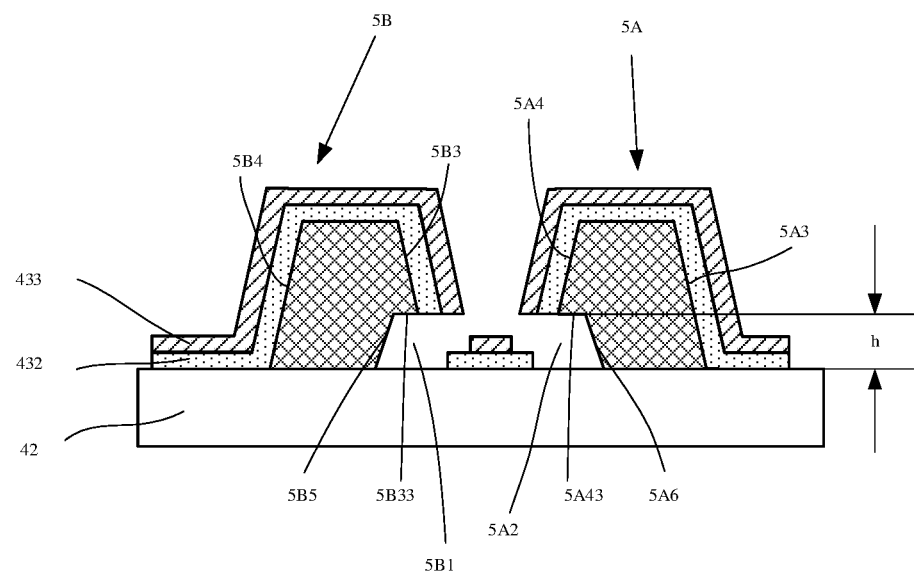
FIG. 4C is a partial enlarged view of part I in FIG. 4A or FIG. 4B.
Figure 5:
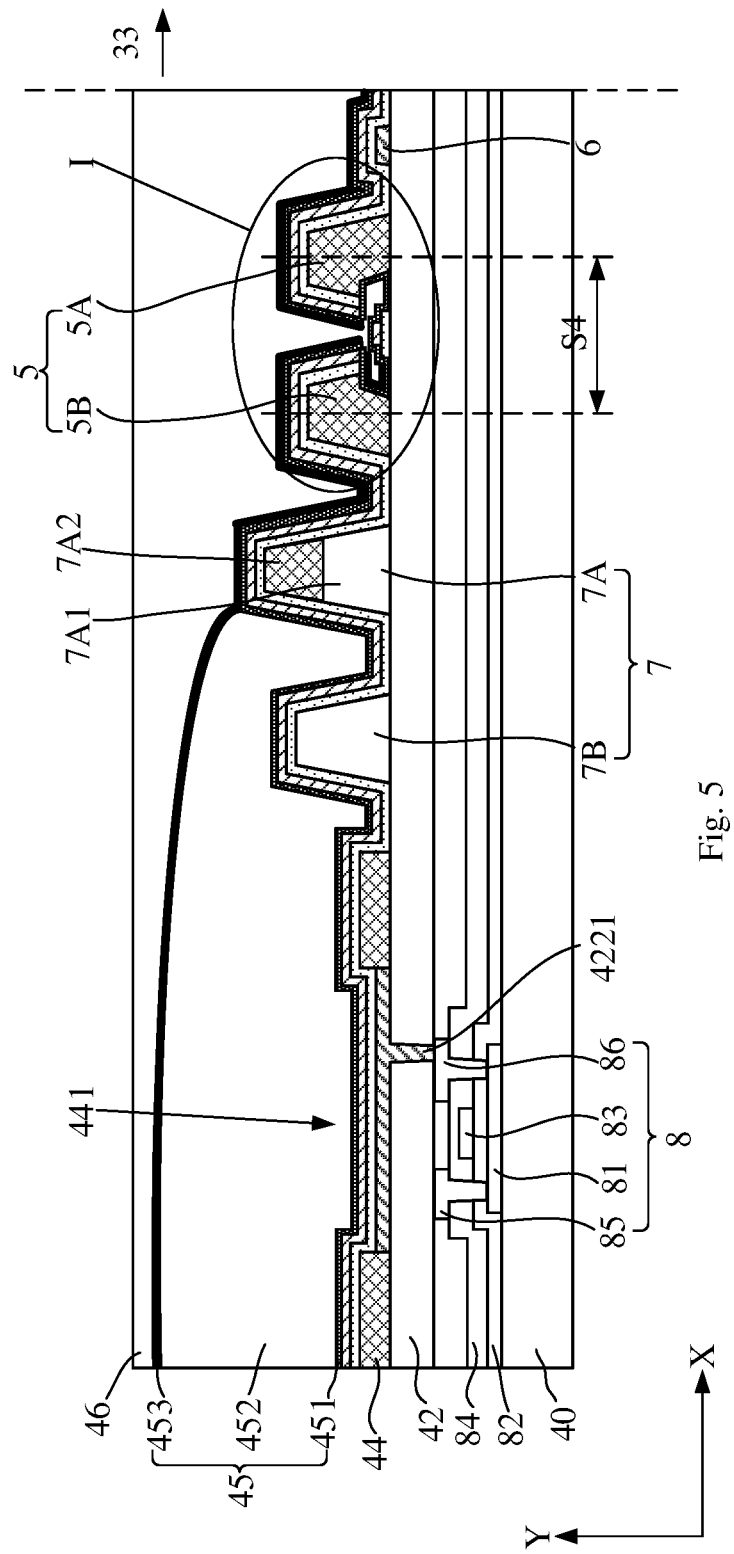
FIG. 5 is a schematic sectional view of the electroluminescent display substrate according to the exemplary embodiments of the present disclosure taken along line A-A' in FIG. 3, wherein only a structure of a part of the electroluminescent display substrate on one side of the aperture is shown.

FIG. 3 shows a plan view of the electroluminescent display substrate according to the exemplary embodiments of the present disclosure. FIG. 4A and FIG. 5 are schematic sectional views of the electroluminescent display substrate according to the exemplary embodiments of the present disclosure taken along line A-A' in FIG. 3, respectively. FIG. 4B is a partial sectional view of the electroluminescent display substrate in FIG. 4A on one side of the aperture. FIG. 4C is an partial enlarged view of part I in FIG. 4A or FIG. 4B. As shown in FIG. 3, the electroluminescent display substrate comprises a display region 31, and at least one aperture 33 in the display region 31. In FIG. 3, two apertures 33 are provided as example for illustration, it should be understood that the embodiments of the present disclosure are not limited thereto, in other embodiments, fewer (for example, one) or more apertures 33 may be provided.

It should be noted that, "aperture" in the context is a region on the substrate for mounting hardware structures, for the convenience of illustration, it is referred to as aperture, however, the aperture comprises but not limit to the following forms: a through hole, a groove, an opening, etc. Optionally, the hardware structures may comprise one or more of the following structures: a front camera, a HOME key, an earpiece or a speaker. The embodiments of the present disclosure do not particularly limit the detailed installation of the hardware structures. Further, the shape of the aperture may depend on the shape of the hardware structures to be mounted, for example, the cross section of the aperture in a direction parallel to a base substrate of the display substrate may have one or more shapes selected from circle, oval, rectangle, rounded rectangle, square, diamond, trapezoid, or the like.

As shown in FIG. 4A and FIG. 4B, the display substrate comprises: a base substrate 40, and a wiring layer 41, an insulating layer 42, an electroluminescent element 43 such as an OLED element, a pixel define layer 44, an encapsulating layer 45 and a planarization layer 46 which are laminated on the base substrate 40.

It should be noted that, in the following description, the OLED element is used as an example to describe the electroluminescent element 43, however, those skilled in the art should understand, the electroluminescent element 43 in the present disclosure does not limit to the OLED element, which may comprise an electroluminescent element of other types, such as a QLED element or the like.

For example, the wiring layer 41 may comprise various circuits and conductive traces for driving the OLED element, and the detailed structure thereof will be described in more details below.

For example, the insulating layer 42 is provided between the wiring layer 41 and the OLED element 43, and it may comprise a planarization layer. In the context, for the convenience of description, the planarization layer 46 may be referred to as a first planarization layer 46, and the planarization layer included in the insulating layer 42 is referred to as a second planarization layer. It should be understood that, the insulating layer 42 may also comprise other film layers that are used for insulation.

For example, the OLED element 43 may comprise a first electrode layer 431, a second electrode layer 433 and a light-emitting layer 432 between the first electrode layer 431 and the second electrode layer 433. Wherein, the first electrode layer 431 may be one of a anode layer and a cathode layer, and the second electrode layer 433 may be the other one of the anode layer and the cathode layer. In one example, the second electrode layer 433 may be the cathode layer, and the light-emitting layer 432 may be the organic light-emitting layer. In this case, both the second electrode layer 433 and the light-emitting layer 432 may be formed through an evaporation process, thus, both the second electrode layer 433 and the light-emitting layer 432 may extend from a region where the OLED element 43 is located (that is, an opening region of a pixel) to a region where the aperture 33 is located.

For example, the pixel define layer 44 defines an opening region 441 of each pixel. Optionally, the pixel define layer 44 may be made of polyimide material. Those skilled in the art should understand, the first electrode layer 431, the second electrode layer 433 and the light-emitting layer 432 in the opening region 441 together constitute the OLED element 43, and the OLED element 43 may be controlled to emit light for display.

For example, the encapsulating layer 45 may comprise a first encapsulating sub-layer 451, a second encapsulating sub-layer 452 and a third encapsulating sub-layer 453 disposed in sequence in a direction away from the base substrate 40. For example, the first encapsulating sub-layer 451 and the third encapsulating sub-layer 453 may be made of inorganic material, and the second encapsulating sub-layer 452 may be made of organic material.

FIG. 4C is a partial enlarged view of the part I in FIG. 4A or FIG. 4B. For a clarified illustration of an eave structure, FIG. 4C omits some film layers. With reference to FIG. 4A, FIG. 4B and FIG. 4C, the display substrate may comprise at least one eave structure 5 on the base substrate 40. The eave structure 5 surrounds the aperture 33, and is located between the aperture 33 and the OLED element 43. For example, the eave structure 5 may be on the same layer with the pixel define layer 44, and is made of the same material as the material of the pixel define layer 44, for example, the eave structure 5 may be made of polyimide material.

For example, the eave structure 5 may comprise at least one undercut, and the undercut is disposed on a side of the eave structure 5 close to the base substrate 40. Specifically, the eave structure 5 may comprise a first side close to the aperture 33 and a second side away from the aperture 33. The at least one undercut may comprise at least one of a first undercut in the first side and a second undercut in the second side. For example, the first undercut extends from the first side towards the second side, a wall of the first undercut away from the aperture constitutes a third side of the eave structure providing with the first undercut, the first side protrudes relative to the third side in a direction pointing to the aperture, so that at least one of the light-emitting layer 432 and the second electrode layer 433 is disconnected at the first undercut. Alternatively or additionally, the second undercut extends from the second side towards the first side, a wall of the second undercut close to the aperture constitutes a fourth side of the eave structure providing with the second undercut, the second side protrudes relative to the fourth side in a direction away from the aperture, so that at least one of the light-emitting layer 432 and the second electrode layer 433 is disconnected at the second undercut.

Specifically, with reference to FIG. 4A and FIG. 4B, the display substrate comprises two eave structures surrounding the aperture, for the convenience of description, the two eave structures are denoted as eave structure 5A and eave structure 5B. In the context, eave structure 5A and eave structure 5B may also be referred to as the first eave structure and the second eave structure, respectively.

Wherein, the first eave structure 5A and the second eave structure 5B are disposed at an interval between the aperture 33 and the OLED element 43, and the first eave structure 5A is closer to the aperture 33 relative to the second eave structure 5B. Both eave structure 5A and eave structure 5B comprise a first side close to the aperture 33 and a second side away from the aperture 33. For example, the first eave structure 5A comprises a first side 5A3 close to the aperture 33 and a second side 5A4 away from the aperture 33, and the second eave structure 5B comprises a first side 5B3 close to the aperture 33 and a second side 5B4 away from the aperture 33. Each eave structure comprises at least one undercut.

For example, the first eave structure 5A comprises one second undercut 5A2 on the second side 5A4 thereof, the second undercut 5A2 is located on the side of the first eave structure 5A close to the base substrate 40, and extends from the second side 5A4 of the first eave structure 5A towards the first side 5A3, so that the second side 5A4 of the first eave structure 5A forms a concave structure on the side of the first eave structure 5A close to the base substrate 40. Specifically, a part of the second side 5A4 of the first eave structure 5A close to the base substrate 40 is cut off, and the wall of the second undercut 5A2 close to the aperture 33 constitutes the fourth side 5A6 of the first eave structure 5A. The second side 5A4 and the fourth side 5A6 are disconnected, that is, an end of the second side 5A4 close to the fourth side 5A6 does not contact with an end of the fourth side 5A6 close to the second side 5A4. As shown in FIG. 4C, the second side 5A4 and the fourth side 5A6 are separated by a horizontal part 5A43. And, the second side 5A4 protrudes relative to the fourth side 5A6 in a direction from the aperture 33 to the OLED element 43. In this way, the second side 5A4 does not contact with a surface providing with the first eave structure 5A (for example, the upper surface of the base substrate) directly, thereby forming a disconnected structure in the second side 5A4 of the first eave structure 5A, that is, forming an eave.

Similarly, the second eave structure 5B comprises one first undercut 5B1 on the first side 5B3 thereof, the first undercut 5B1 is located on the side of the second eave structure 5B close to the base substrate 40, and extends from the first side 5B3 of the second eave structure 5B towards the second side 5B4, so that the first side 5B3 of the second eave structure 5B forms a concave structure on the side of the second eave structure 5B close to the base substrate 40. Specifically, a part of the first side 5B3 of the second eave structure 5B close to the base substrate 40 is cut off, the wall of the first undercut 5B1 away from the aperture 33 constitutes the third side 5B5 of the second eave structure 5B. The first side 5B3 and the third side 5B5 are disconnected, that is, an end of the first side 5B3 close to the third side 5B5 does not contact with an end of the third side 5B5 close to the first side 5B3. As shown in FIG. 4C, the first side 5B3 and the third side 5B5 are separated by a horizontal part 5B33. And, the first side 5B3 protrudes relative to the third side 5B5 in a direction from the OLED element 43 to the aperture 33. In this way, the first side 5B3 does not contact with a surface providing with the second eave structure 5B (for example, the upper surface of the base substrate) directly, thereby forming a disconnected structure in the first side 5B3 of the second eave structure 5B, that is, forming an eave.

By providing such an eave structure, the light-emitting layer 432 and the second electrode layer 433 formed through an evaporation process are disconnected at the eave structure. For example, in the embodiments shown in FIG. 4A, the light-emitting layer 432 and the second electrode layer 433 are disconnected at both the second undercut 5A2 of the first eave structure 5A and the first undercut 5A1 of the second eave structure 5B. In this way, the invasion path P shown in FIG. 2 is cut off, so that the encapsulation dependence is improved.

In the embodiments shown in FIG. 4A-FIG. 4C, the display substrate comprises two eave structures 5A and 5B, and each eave structure only comprises one undercut on one side, however, the embodiments of the present disclosure do not limit to this. For example, the display substrate may comprise fewer (for example, one) or more (for example, three, four, five, six or more) eave structures, and/or each eave structure may comprise two undercuts on two sides, respectively.

Figure 6:
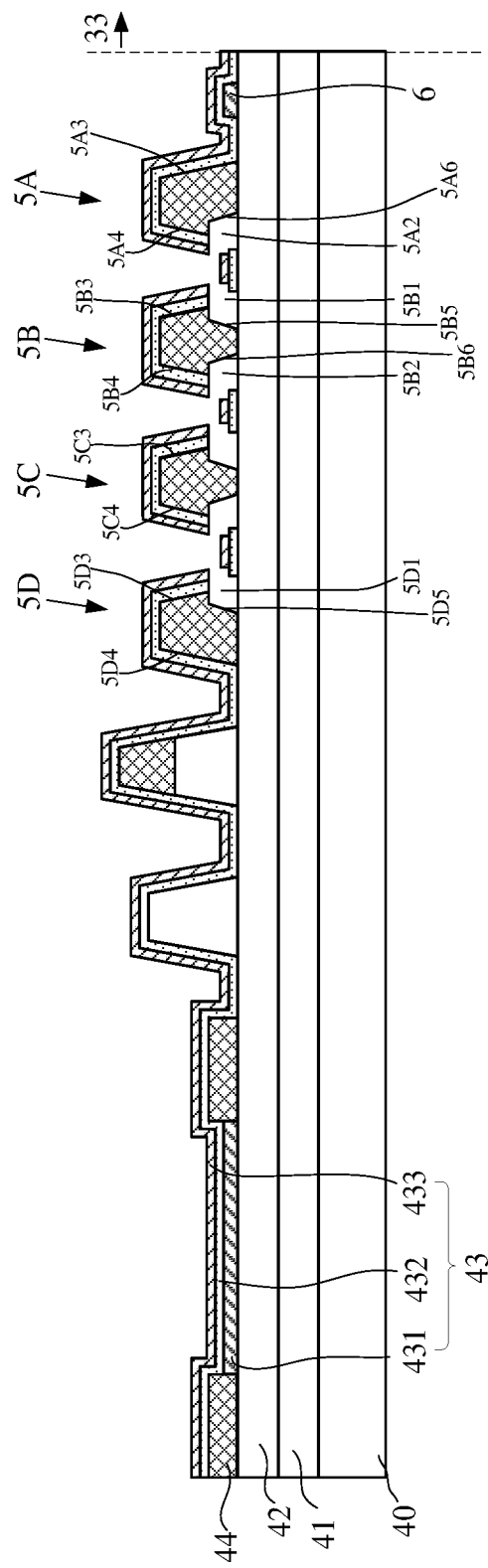
FIG. 6 is a schematic sectional view of an electroluminescent display substrate according to the exemplary embodiments of the present disclosure taken along line A-A' in FIG. 3, wherein only a structure of a part of the electroluminescent display substrate on one side of the aperture is shown.

With reference to FIG. 6, the display substrate may comprise four eave structures surrounding the aperture 33, for the convenience of description, the four eave structures are denoted as eave structures 5A, 5B, 5C, 5D. In the context, the eave structures 5A, 5B, 5C, 5D may also be referred to as the first eave structure, the second eave structure, the third eave structure and the fourth eave structure. Wherein, the eave structures 5A, 5B, 5C, 5D are disposed in sequence between the aperture 33 and the OLED element 43 in a direction from the aperture 33 to the OLED element 43, and the eave structures 5A, 5B, 5C, 5D are disposed at intervals. Each eave structure comprises a first side close to the aperture 33 and a second side away from the aperture 33.

For example, the first eave structure 5A comprises a first side 5A3 close to the aperture 33 and a second side 5A4 away from the aperture 33, the second eave structure 5B comprises a first side 5B3 close to the aperture 33 and a second side 5B4 away from the aperture 33, the third eave structure 5C comprises a side 5C3 close to the aperture 33 and a side away from the aperture 33, and the fourth eave structure 5D comprises a side 5D3 close to the aperture 33 and a side 5D4 away from the aperture 33. Each eave structure comprises at least one undercut.

For example, the first eave structure 5A comprises one second undercut 5A2 in the second side 5A4 thereof, the second undercut 5A2 is located on the side of the first eave structure 5A close to the base substrate 40, and extends from the second side 5A4 of the first eave structure 5A towards the first side 5A3, so that the second side 5A4 of the first eave structure 5A forms a concave structure on the side of the first eave structure 5A close to the base substrate 40. Specifically, a part of the second side 5A4 of the first eave structure 5A close to the base substrate 40 is cut off, and the wall of the second undercut 5A2 close to the aperture 33 constitutes the fourth side 5A6 of the first eave structure 5A. The second side 5A4 and the fourth side 5A6 are disconnected, that is, the end of the second side 5A4 close to the fourth side 5A6 does not contact with the end of the fourth side 5A6 close to the second side 5A4. As shown in FIG. 6, the second side 5A4 and the fourth side 5A6 are separated by a horizontal part. And, the second side 5A4 protrudes relative to the fourth side 5A6 in a direction from the aperture 33 to the OLED element 43. In this way, the second side 5A4 does not contact with a surface providing with the first eave structure 5A (for example, the upper surface of the base substrate) directly, thereby forming a disconnected structure on the second side 5A4 of the first eave structure 5A, that is, forming an eave.

For example, the second eave structure 5B comprises one first undercut 5B1 on the first side 5B3 thereof and one second undercut 5B2 on the second side 5B4 thereof. Both the first undercut 5B1 and the second undercut 5B2 are located on the side of the second eave structure 5B close to the base substrate 40, the first undercut 5B1 extends from the first side 5B3 of the second eave structure 5B towards the second side 5B4, and the second undercut 5B2 extends from the second side 5B4 of the second eave structure 5B towards the first side 5B3, so that both the first side 5B3 and the second side 5B4 of the second eave structure 5B form concave structures on the side of the second eave structure 5B close to the base substrate 40. Specifically, a part of the first side 5B3 of the second eave structure 5B close to the base substrate 40 is cut off, and the wall of the first undercut 5B1 away from the aperture 33 constitutes the third side 5B5 of the second eave structure 5B. The first side 5B3 and the third side 5B5 are disconnected, that is, the end of the first side 5B3 close to the third side 5B5 does not contact with the end of the third side 5B5 close to the first side 5B3. As shown in FIG. 6, the first side 5B3 and the third side 5B5 are separated by a horizontal part. And, the first side 5B3 protrudes relative to the third side 5B5 in the direction from the OLED element to the aperture 33. In this way, the first side 5B3 does not contact with a surface providing with the second eave structure 5B (for example, the upper surface of the base substrate) directly, thereby forming a disconnected structure on the first side 5B3 of the second eave structure 5B, that is, forming an eave. Similarly, a part of the second side 5B4 of the second eave structure 5B close to the base substrate 40 is cut off, and a wall of the second undercut 5B2 close to the aperture 33 constitutes the fourth side 5B6 of the second eave structure 5B. The second side 5B4 and the fourth side 5B6 are disconnected, that is, the end of the second side 5B4 close to the fourth side 5B6 does not contact with the end of the fourth side 5B6 close to the second side 5B4. As shown in FIG. 6, the second side 5B4 and the fourth side 5B6 are separated by a horizontal part. And, the second side 5B4 protrudes relative to the fourth side 5B6 in the direction from the aperture 33 to the OLED element 43. In this way, the second side 5B4 does not contact with the surface providing with the second eave structure 5B (for example, the upper surface of the base substrate 40) directly, thereby forming a disconnected structure on the second side 5B4 of the second eave structure 5B, that is, forming an eave.

With reference to FIG. 6, the third eave structure 5C may have the same structure as the second eave structure, and reference may be made to the above description of the second eave structure 5B, which will not be repeated here.

Similarly, the fourth eave structure 5D comprises one first undercut 5D1 on the first side 5D3 thereof, the first undercut is located on the side of the fourth eave structure 5D close to the base substrate 40, and extends from the first side 5D3 of the fourth eave structure 5D towards the second side 5D4, so that the first side 5D3 of the fourth eave structure 5D forms a concave structure on the side of the fourth eave structure 5D close to the base substrate 40. Specifically, a part of the first side 5D3 of the fourth eave structure 5D close to the base substrate 40 is cut off, and a wall of the first undercut 5D3 away from the aperture 33 constitutes a third side 5D5 of the fourth eave structure 5D. The first side 5D3 and the third side 5D5 are disconnected, that is, the end of the first side 5D3 close to the third side 5D5 does not contact with the end of the third side 5D5 close to the first side 5D3. As shown in FIG. 6, the first side 5D3 and the third side 5D5 are separated by a horizontal part. And, the first side 5D3 protrudes relative to the third side 5D5 in the direction from the OLED element 43 to the aperture 33. In this way, the first side 5D3 does not contact with a surface providing with the fourth eave structure 5D (for example, the upper surface of the base substrate 40) directly, thereby forming a disconnected structure on the first side 5D3 of the fourth eave structure 5D, that is, forming an eave.

Optionally, in some embodiments of the present disclosure, the display substrate may comprise a plurality of eave structures 5 disposed at intervals, and the intervals between the plurality of eave structures may be different from those in the embodiments shown in FIG. 4A and FIG. 6.

Figure 7:
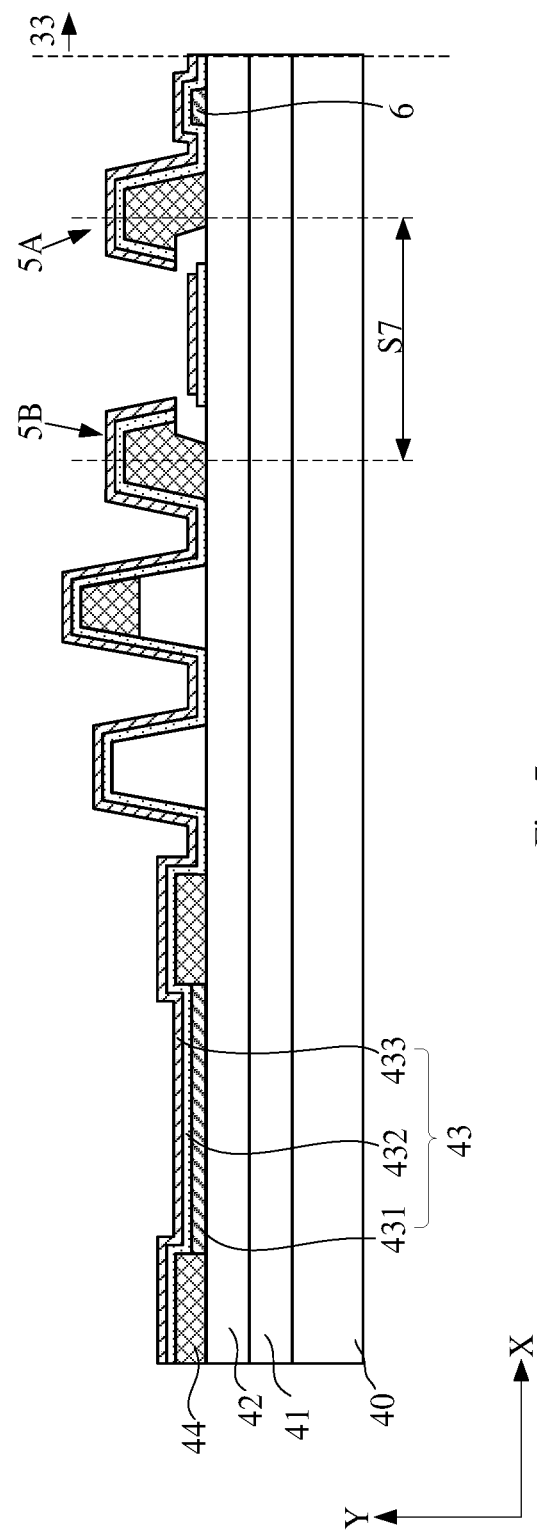
FIG. 7 is a schematic sectional view of an electroluminescent display substrate according to the exemplary embodiments of the present disclosure taken along line A-A' in FIG. 3, wherein only a structure of a part of the electroluminescent display substrate on one side of the aperture is shown.

For example, with reference to FIG. 7, the display substrate comprises a plurality of (for example, two) eave structures 5A, 5B, eave structure 5A and eave structure 5B are disposed between the aperture 33 and the OLED element 43 at an interval. The interval S7 between the eave structure 5A and the eave structure 5B may be larger than the interval S4 between the eave structure 4A and the eave structure 4B shown in FIG. 4B.

In the embodiments above, in the plurality of eave structures, the undercuts of some eave structures are disposed on the first side of the eave structure, and the undercuts of the other eave structures are disposed on the second side of the eave structure, however, the embodiments of the present disclosure do not limit to this. For example, in other embodiments, the undercut of each of the plurality of eave structures may be disposed on the first side or on the second side.

Figure 8:
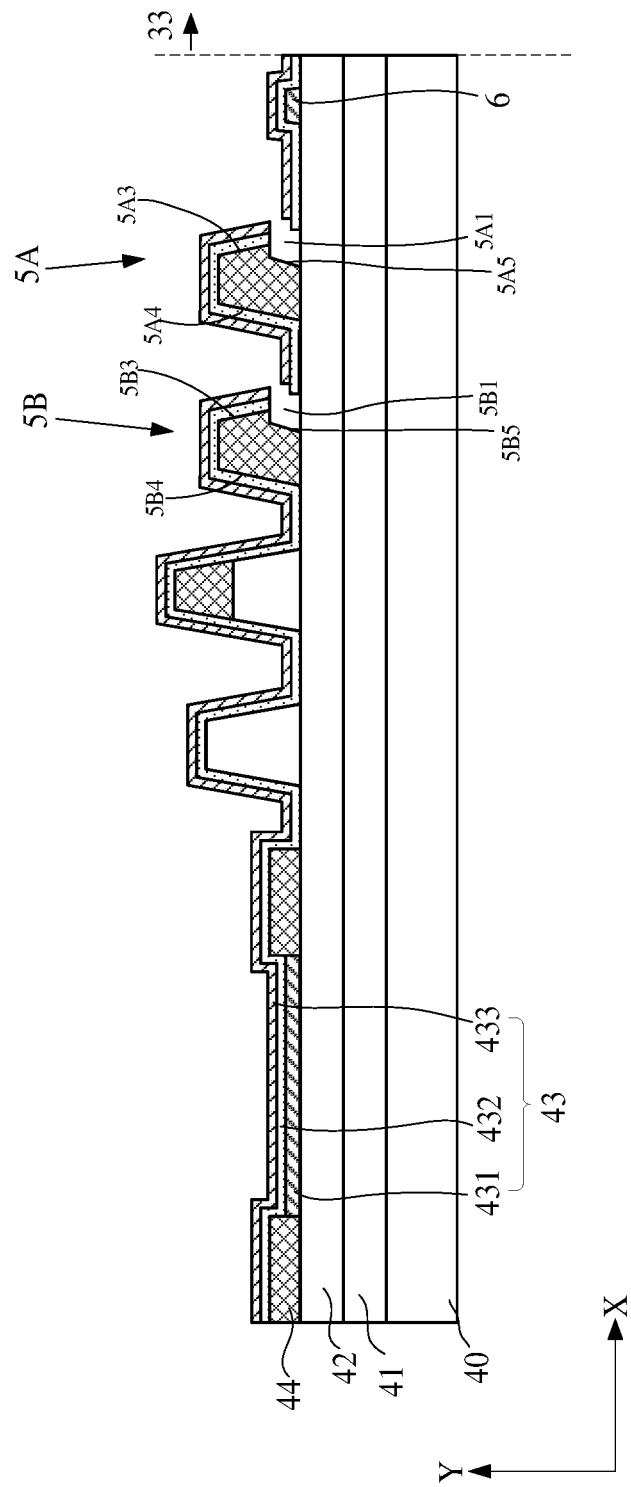
FIG. 8 is a schematic sectional view of an electroluminescent display substrate according to the exemplary embodiments of the present disclosure taken along line A-A' in FIG. 3, wherein only a structure of a part of the electroluminescent display substrate on one side of the aperture is shown.

For example, with reference to FIG. 8, the display substrate comprises two eave structures surrounding the aperture 33, for the convenience of description, the two eave structures are denoted as eave structure 5A and eave structure 5B. In the context, eave structure 5A and the eave structure 5B may also be referred to as the first eave structure and the second eave structure.

Wherein, the first eave structure 5A and the second eave structure 5B are disposed between the aperture 33 and the OLED element 43 at an interval, the first eave structure 5A is closer to the aperture 33 relative to the second eave structure 5B. Each eave structure comprises a first side close to the aperture 33 and a second side away from the aperture 33. For example, the first eave structure 5A comprises a first side 5A3 close to the aperture 33 (that is, the first side) and a second side 5A4 away from the aperture 33 (that is, the second side), the second eave structure 5B comprises a first side 5B3 close to the aperture 33 (that is, the first side) and a second side 5B4 away from the aperture 33 (that is, the second side). Each eave structure comprises at least one undercut.

For example, the first eave structure 5A comprises one first undercut 5A1 on the first side 5A3 thereof, the first undercut 5A1 is located on the side of the first eave structure 5A close to the base substrate 40, and extends from the first side 5A3 of the first eave structure 5A towards the second side 5A4, so that the first side 5A3 of the first eave structure 5A forms a concave structure on the side of the first eave structure 5A close to the base substrate 40. Specifically, a part of the first side 5A3 of the first eave structure 5A close to the base substrate 40 is cut off, and a wall of the first undercut 5A1 away from the aperture 33 constitutes the third side 5A5 of the first eave structure 5A. The first side 5A3 and the third side 5A5 are disconnected, that is, the end of the first side 5A3 close to the third side 5A5 does not contact with the end of the third side 5A5 close to the first side 5A3. As shown in FIG. 8, the first side 5A3 and the third side 5A5 are separated by a horizontal part. And, the first side 5A3 protrudes relative to the third side 5A5 in a direction from the OLED element 43 to the aperture 33. In this way, the first side 5A3 does not contact with a surface providing with the first eave structure 5A (for example, the upper surface of the base substrate 40) directly, thereby forming a disconnected structure in the first side 5A3 of the first eave structure 5A, that is, forming an eave.

Similarly, the second eave structure 5B comprises one first undercut 5B1 on the first side 5B3 thereof, the first undercut 5B1 is located on the side of the second eave structure 5B close to the base substrate 40, and extends from the first side 5B3 of the second eave structure 5B towards the second side 5B4, so that the first side 5B3 of the second eave structure 5B forms a concave structure on the side of the second eave structure 5B close to the base substrate 40. Specifically, a part of the first side 5B3 of the second eave structure 5B close to the base substrate 40 is cut off, and a wall of the first undercut 5B1 away from the aperture 33 constitutes the third side 5B5 of the second eave structure 5B. The first side 5B3 and the third side 5B5 are disconnected, that is, the end of the first side 5B3 close to the third side 5B5 does not contact with the end of the third side 5B5 close to the first side 5B3. As shown in FIG. 8, the first side 5B3 and the third side 5B5 are separated by a horizontal part. And, the first side 5B3 protrudes relative to the third side 5B5 in the direction from the OLED element to the aperture 33. In this way, the first side 5B3 does not contact with a surface providing with the second eave structure 5B (for example, the upper surface of the base substrate 40) directly, thereby forming a disconnected structure on the first side 5B3 of the second eave structure 5B, that is, forming an eave.

Figure 9:
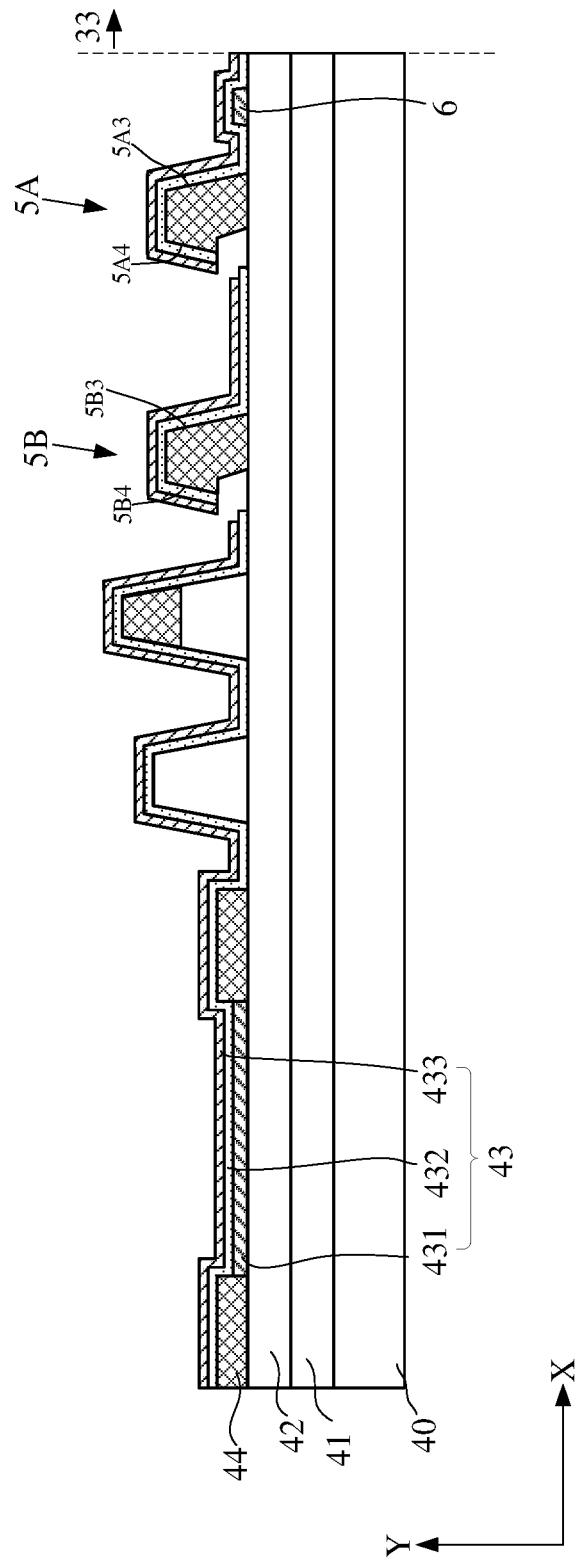
FIG. 9 is a schematic sectional view of an electroluminescent display substrate according to the exemplary embodiments of the present disclosure taken along line A-A' in FIG. 3, wherein only a structure of a part of the electroluminescent display substrate on one side of the aperture is shown.

For example, with reference to FIG. 9, the display substrate comprises two eave structures surrounding the aperture 33, for the convenience of description, the two eave structures are denoted as eave structure 5A and eave structure 5B. In the context, eave structure 5A and the eave structure 5B may also be referred to as the first eave structure and the second eave structure.

Wherein, the first eave structure 5A and the second eave structure 5B are disposed between the aperture 33 and the OLED element 43 at an interval, the first eave structure 5A is closer to the aperture 33 relative to the second eave structure 5B. Each eave structure comprises a first side close to the aperture 33 and a second side away from the aperture 33. For example, the first eave structure 5A comprises a first side 5A3 close to the aperture 33 (that is, the first side) and a second side 5A4 away from the aperture 33 (that is, the second side), the second eave structure 5B comprises a first side 5B3 close to the aperture 33 (that is, the first side) and a second side 5B4 away from the aperture 33 (that is, the second side). Each eave structure comprises at least one undercut. In the embodiment shown in FIG. 9, the undercut of each eave structure is disposed on the second side of the eave structure. Reference may be made to the above description of detailed structure thereof, which will not be repeated here.

In the embodiments of the present disclosure, the light-emitting layer 432 and the second electrode layer 433 formed through an evaporation process are disconnected at the eave structure by providing the eave structure. For example, in the embodiments shown in FIG. 4A and FIGS. 6-9, the light-emitting layer 432 and the electrode layer 433 are disconnected at the at least one undercut of the first sides and the second sides of all the eave structures. In this way, the invasion path P in FIG. 2 is cut off, and the encapsulation dependence is improved.

Specifically, as shown in FIGS. 4A-4C, the display substrate further comprises a light-emitting layer 432 and a second electrode layer 433 on a side of the first eave structure 5A and the second eave structure 5B away from the base substrate 40, and the light-emitting layer 432 and the second electrode layer 433 are disconnected at both the second undercut 5A2 of the first eave structure 5A and the first undercut 5B1 of the second eave structure 5B. It should be noted that, "disconnected" herein means that the layer does not extend continuously, for example, each of the light-emitting layer 432 and the second electrode layer 433 does not extend continuously at both the second undercut 5A2 of the first eave structure 5A and the first undercut 5B1 of the second eave structure 5B. Specifically, the light-emitting layer 432 comprises a first part covering the first eave structure, a second part between the first eave structure 5A and the second eave structure 5B and a third part covering the second eave structure 5B. Due to the second undercut 5A2 of the first eave structure 5A, the first part and the second part of the light-emitting layer 432 are disconnected, and they are separated in Y direction by a distance which is approximately equal to the height of the second undercut 5A2. Due to the first undercut 5B1 of the second eave structure 5B, the second part and the third part of the light-emitting layer 432 are disconnected, they are separated in Y direction by a distance which is approximately equal to the height of the first undercut 5B1. Optionally, the second electrode layer 433 is disposed in a similar way to the light-emitting layer 432.

Similarly, as shown in FIGS. 6-9, the light-emitting layer 432 and the second electrode layer 433 are disconnected at the undercuts of all the eave structures, which will not be repeated here.

With reference to FIGS. 4A-9, the display substrate may further comprise a positioning structure 6 on the base substrate 40, the positioning structure 6 is disposed surrounding the aperture 33, and is located between the aperture 33 and the eave structure 5. For example, the positioning structure 6 may be on the same layer with the first electrode layer 431, and is made of the same material as the material of the first electrode layer 431. For example, the positioning structure 6 and the first electrode layer 431 may have laminated structures of ITO/Ag/ITO, respectively. Wherein, ITO is indium tin oxide, and Ag is metallic silver. More specifically, the ITO therein may be ITO in a crystalline state, that is, p-ITO.

For example, in the case in which a plurality of eave structures are provided, the positioning structure 6 is disposed between the aperture 33 and the first eave structure 5A closest to the aperture 33.

For example, the aperture 33 is usually formed through a laser processing process. By providing the positioning structure 6 surrounding the aperture 33, the positioning structure 6 may reflect laser to an extent, in particular, Ag in the positioning structure 6 may reflect laser. In this way, even the laser processing device has a certain cutting deviation, it is still possible to avoid the laser cutting the region on a side of the positioning structure 6 away from the aperture 33, thereby avoiding the encapsulation failure problem that otherwise may occur.

For example, the size (that is, the thickness) of the positioning structure 6 in a direction perpendicular to the base substrate 40 (that is, Y direction in the drawings) is approximately 1100 Å (angstrom). The height of the undercut of the eave structure 5 (indicated by h in FIG. 4B) may be larger than the thickness. For example, both the height h of the second undercut 5A2 of the first eave structure 5A and the height h of the first undercut 5B1 of the second eave structure 5B in FIG. 4B are larger than the thickness. In this way, the light-emitting layer 432 and the second electrode layer 433 formed on the eave structure are separated from the light-emitting layer 432 and the second electrode layer 433 formed on the upper surface of the base substrate 40 by a relatively large distance, making sure the light-emitting layer 432 and the second electrode layer 433 are disconnected at the undercuts of all the eave structures, thereby the encapsulation dependence is further improved.

With reference to FIGS. 4A-9, the display substrate may also comprise a blocking dam 7, the blocking dam 7 is disposed surrounding the aperture 33, and is located between the eave structure 5 and the OLED element 43. The blocking dam 7 may block water vapor and oxygen, so that water vapor and oxygen are prevented from intruding into the OLED element from the cutting surface of the aperture 33, and it is less possible for cracks which may be formed when cutting the aperture to extend towards the interior of the display substrate, thereby the encapsulation dependence is further improved.

For example, the blocking dam 7 may comprise a first blocking dam 7A and a second blocking dam 7B. The first blocking dam 7 and the second blocking dam 7B are disposed in sequence in a direction from the aperture 33 to the OLED element 43, that is, the first blocking dam 7A is closer to the eave structure 5 relative to the second blocking dam 7B.

The first blocking dam 7A may comprise a first blocking dam sub-layer 7A1 and a second blocking dam sub-layer 7A2, and the second blocking dam sub-layer 7A2 is disposed on the side of the first blocking dam sub-layer 7A1 away from the base substrate 40. The first blocking dam sub-layer 7A1 may be on the same layer with the second blocking dam 7B. The second blocking dam sub-layer 7A2 may be on the same layer with the pixel define layer 44 and the eave structure 5.

In the embodiments of the present disclosure, the eave structure 5 and the positioning structure 6 are both protruded structures disposed surrounding the aperture 33, similar to the blocking dam 7, they may block water vapor and oxygen as well, so that water vapor and oxygen are prevented from intruding into the OLED element from the cutting surface of the aperture 33, and it is less possible for cracks which may be formed when cutting the aperture to extend towards the interior of the display substrate, thereby the encapsulation dependence is further improved.

With reference to FIGS. 4A-9, a second encapsulating sub-layer 452 of the encapsulating layer 45 is located on the side of the first blocking dam 7A away from the aperture 33, and the first encapsulating sub-layer 451 and the third encapsulating sub-layer 453 of the encapsulating layer 45 extend continuously from the region of the OLED element 43 to the cutting surface of the aperture 33. That is, the first encapsulating sub-layer 451 and the third encapsulating sub-layer 453 are not disconnected at the undercut of the eave structure 5. In this way, the first encapsulating sub-layer 451 and the third encapsulating sub-layer 453 cover all the eave structures 5. And, the first encapsulating sub-layer 451 and the third encapsulating sub-layer cover the positioning structure 6. In this way, all of the eave structures 5 and the positioning structures 6 are covered with inorganic layers, thereby the encapsulation dependence is further improved.

With reference to FIG. 4A, a first planarization layer 46 is disposed on the side of the eave structure 5 and the positioning structure 6 away from the base substrate 40. For example, the first planarization layer 46 fulfills the undercuts of the eave structures, and fulfills the intervals between the eave structure and the blocking dam and the intervals between any two ones of the eave structures. For example, the first planarization layer 46 may be formed through an ink-jet printing (that is, IJP) processing, a coating process, etc. In this way, the material forming the first planarization layer 46 may be prevented from flowing into the aperture 33 as it may be blocked by the eave structure 5 and the positioning structure 6.

It should be noted that, with reference to FIG. 4A, the aperture 33 penetrates the base substrate and various film layers on the display substrate in a direction perpendicular to the base substrate 40. Optionally, the display substrate according to the embodiments of the present disclosures may be applied to a full-screen and frameless display panel. The aperture 33 may be disposed in the display region, that is, the hardware structures may be mounted in the display region, thereby the border may be reduced and the effective area of the display region is increased, and thereby the manufacture of the full-screen is achieved. The rectangular region 33 located in the central position and being enclosed by the dashed frame in FIG. 4A is the position of the aperture, and the aperture 33 penetrates the base substrate 40 and various film layers in a direction perpendicular to the base substrate 40 (that is Y direction in FIG. 4A), thereby forming a structure as shown in FIG. 4A. Of course, the embodiments of the present disclosure do not limit to this, the aperture may be provided to penetrate only other film layers except the base substrate in Y direction according to requirements, for example, the aperture 33 at least penetrates the encapsulating layer. The part which is actually penetrated by the aperture may be set according to the requirements, and is not specifically limited herein.

Further, with reference to FIG. 5, the wiring layer 41 may comprise a thin film transistor for driving the OLED element 43. Hereinafter, the embodiments of the present disclosure will be further described by taking the TFT thin film transistor as an example.

With reference to FIG. 5, the thin film transistor 8 comprises: an active layer 81 on the base substrate 40, a gate insulating layer 82 on a side of the active layer 81 away from the base substrate 40, a gate electrode 83 on a side of the gate insulating layer 82 away from the base substrate 40, an interlayer dielectric layer 84 on a side of the gate electrode 83 away from the base substrate 40 and covering the gate electrode 83, and a first conductive layer on a side of the interlayer dielectric layer 84 away from the base substrate 40. The first conductive layer may comprise a source electrode 85 and a drain electrode 86 of the thin film transistor and a conductive plug formed in a via hole of the interlayer dielectric layer 84, and the source electrode 85 and the drain electrode 86 of the thin film transistor are electrically connected to the active layer 81 via their respective conductive plugs, respectively.

The first electrode layer 431 is electrically connected to the drain electrode 86 via a conductive plug 4221 formed in the via hole of the insulating layer 42. In this way, the electric connection between the wiring layer 41 and the OLED element 43 is achieved.

Figure 10:
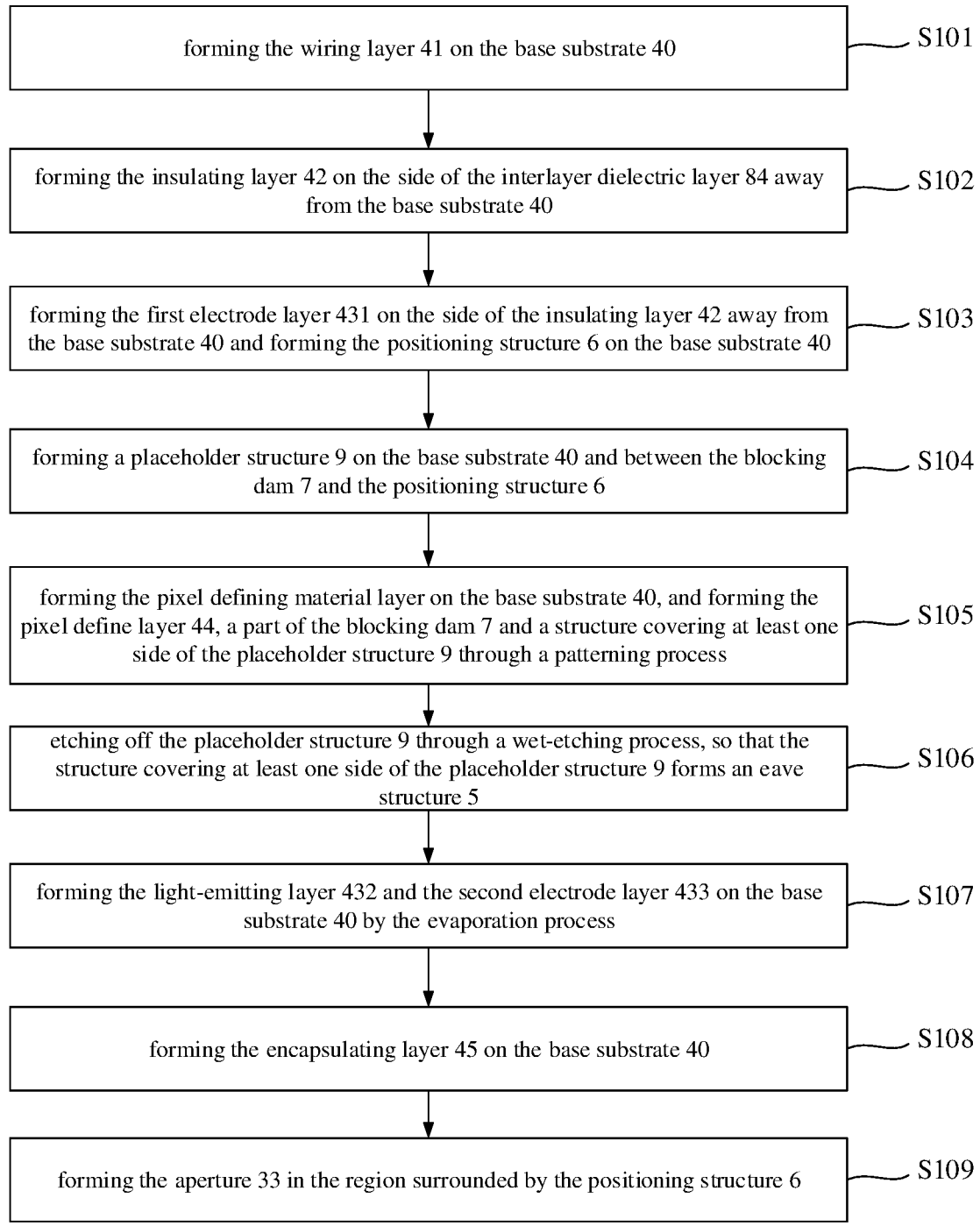
FIG. 10 is a flow chart of a manufacturing method of the electroluminescent display substrate according to some exemplary embodiments of the present disclosure.

FIG. 10 is a flow chart of a manufacturing method of the electroluminescent display substrate according to the embodiments of the present disclosures, with reference to FIGS. 4A-5, FIG. 10 and FIGS. 11A-11H, the manufacturing method may be performed in the following steps. It should be noted that, according to some embodiments of the present disclosure, some of the following steps may be performed individually or in combination, and may be performed in parallel or in sequence, which are not limited to the detailed operation sequence described below.

Figure 11A:
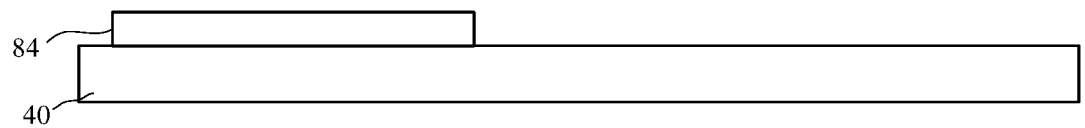
FIG. 11A-FIG. 11H are partial sectional views of structures formed after performing several steps of the manufacturing method of the electroluminescent display substrate according to the exemplary embodiments of the present disclosure.

In step S101, the wiring layer 41 is formed on the base substrate 40. For example, various film layers of the thin film transistor 8 are formed in sequence, comprising but not limited to, the active layer 81, the gate insulating layer 82, the gate electrode 83, the interlayer dielectric layer 84, the first conductive layer, etc. As shown in FIG. 11A, when forming the interlayer dielectric layer 84 through a patterning process, the interlayer dielectric layer 84 in the region in which the aperture is to be formed may be removed. It should be noted that, for the simplification of the drawing, only the interlayer dielectric layer 84 is shown in FIG. 11A, and the other film layers of the wiring layer are omitted.

Figure 11B:
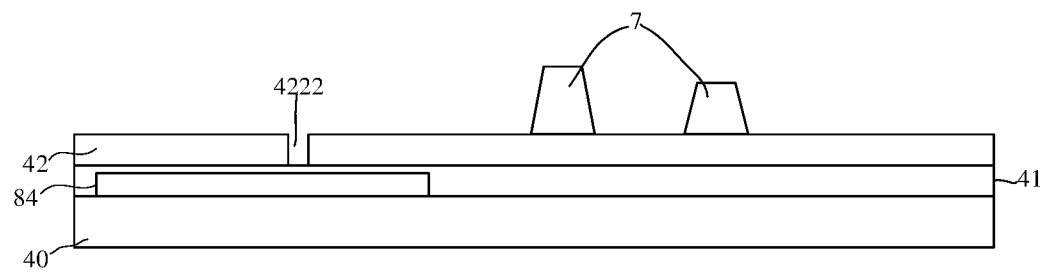

In step S102, the insulating layer 42 is formed on the side of the interlayer dielectric layer 84 away from the base substrate 40. For example, in the step, the second planarization layer is formed. As shown in FIG. 11B, when forming the second planarization layer through a patterning process, the second planarization layer in the region in which the aperture is to be formed may be removed, so that a pattern of the blocking dam is formed and a via hole 4222 is formed in the second planarization layer.

Figure 11C:
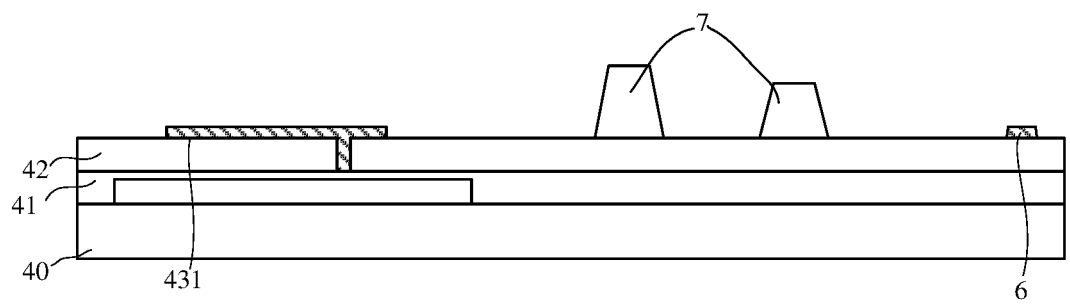

In step S103, the first electrode layer 431 is formed on the side of the insulating layer 42 away from the base substrate 40 and the positioning structure 6 is formed on the base substrate 40, as shown in FIG. 11C. For example, the positioning structure 6 and the first electrode layer 431 may have laminated structures of ITO/Ag/ITO. Wherein, ITO is indium tin oxide, and Ag is metallic silver. In the step, ITO may be annealed to transfer ITO into crystalline ITO, that is p-ITO. The conductive capacity of the first electrode layer 431 may be increased through a processing like this, and unstable a-ITO may also be transferred into stable p-ITO. For example, the thickness (that is, the dimension in Y direction) of the positioning structure 6 and the first electrode layer 431 may be about 1100 Å (angstroms).

Figure 11D:
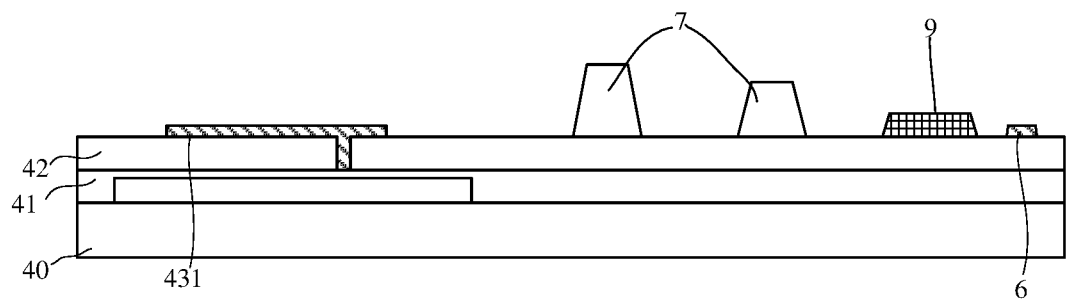

In step S104, a placeholder structure 9 is formed on the base substrate 40 and between the blocking dam 7 and the positioning structure 6, as shown in FIG. 11D. For example, the placeholder structure 9 may be made of indium zinc oxide (that it IZO). Optionally, the placeholder structure 9 may be made of IGZO. Of course, the embodiments of the present disclosure are not limited to this, selection of the material of the placeholder structure 9 may obey the following rules: for the same one etching solution (for example, etching solution comprising oxalic acid), the material of the placeholder structure 9 and the material of the first electrode layer 431 may be selectively etched, that is, the etching solution is capable of etching off the material of the placeholder structure 9, but is not capable of etching off the material of the first electrode layer 431.

Optionally, the thickness of the placeholder structure 9 is larger than the thickness of the first electrode layer 431 or the positioning structure 6. For example, the thickness thereof may be larger than 1100 Å. The width of the placeholder structure 9 may be set according to requirements.

Figure 11E:
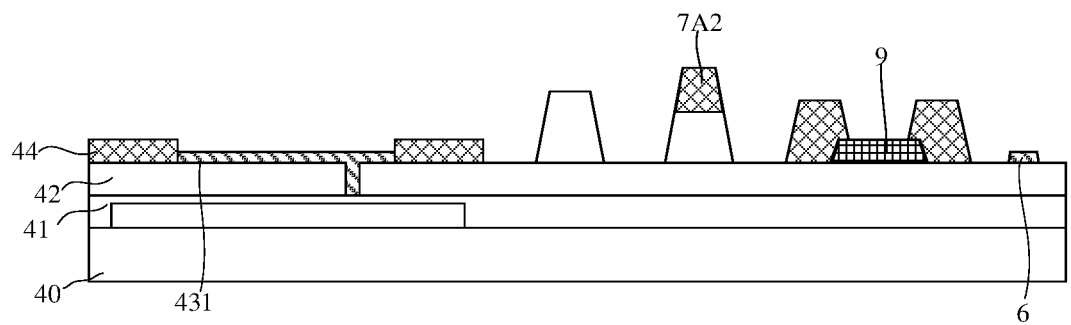

In step S105, the pixel defining material layer is formed on the base substrate 40, and the pixel define layer 44, a part of the blocking dam 7 (for example, the second blocking dam sub-layer 7A2) and a structure covering at least one side of the placeholder structure 9 are formed through a patterning process, as shown in FIG. 11E.

Figure 11F:
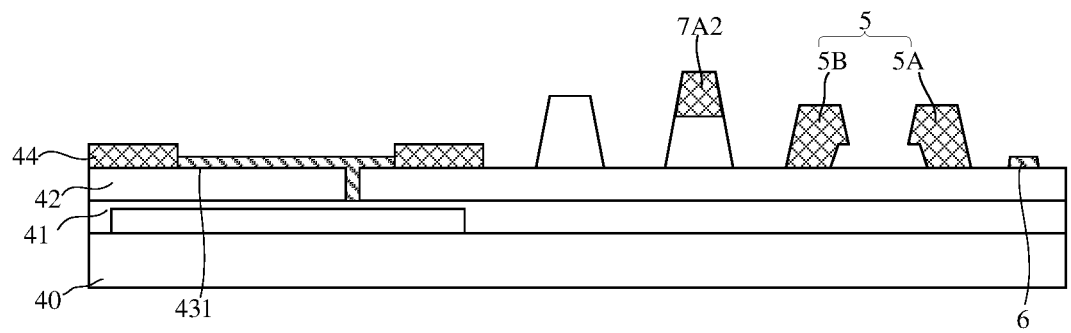

In step S106, the placeholder structure 9 is etched off through a wet-etching process, so that the structure covering at least one side of the placeholder structure 9 forms an eave structure 5, as shown in FIG. 11F. In the step, the etching solution used in the wet-etching process has different etching rates for the material of the placeholder structure 9 and the material of the first electrode layer 431, for example, the etching rate of the etching solution for the placeholder structure 9 is greater than the etching rate of the etching solution for the first electrode layer 431, and even the etching rate of the etching solution for the first electrode layer 431 is substantially zero. Thus, while the placeholder structure 9 is etched off, the first electrode layer 431 and the positioning structure 6 may not be removed.

In one example, the material of the placeholder structure 9 may comprise material containing zinc oxide such as IZO, IGZO, etc., the material of the first electrode layer 431 may comprise material not containing zinc oxide such as ITO etc., and the etching solution may contain oxalic acid. As oxalic acid has different etching rates for ITO and IZO (or IGZO), it may be guaranteed that the first electrode layer 431 and the positioning structure 6 are not removed while the placeholder structure 9 is etched off.

After the placeholder structure 9 is etched off, the eave structure is formed. For example, as shown in FIG. 4B and FIG. 11F, a first eave structure 5A and a second eave structure 5B are formed, reference may be made to the above description of the detailed structure thereof, which will not be repeated here.

Figure 11G:
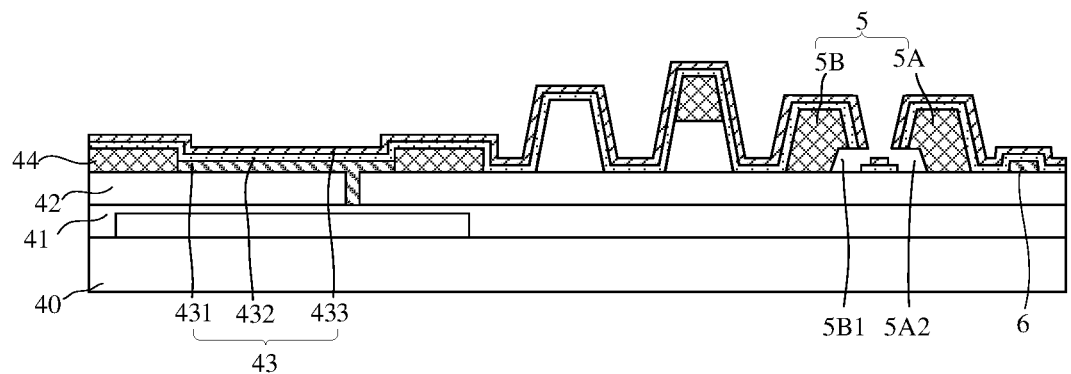

In step S107, the light-emitting layer 432 and the second electrode layer 433 are formed on the base substrate 40 by the evaporation process. As shown in FIG. 11G, the light-emitting layer 432 and the second electrode layer 433 extend from the region of the OLED element 43 to the cutting surface of the aperture 33, but they are disconnected at both the second undercut 5A2 of the first eave structure 5A and the first undercut 5B1 of the second eave structure 5B.

Figure 11H:
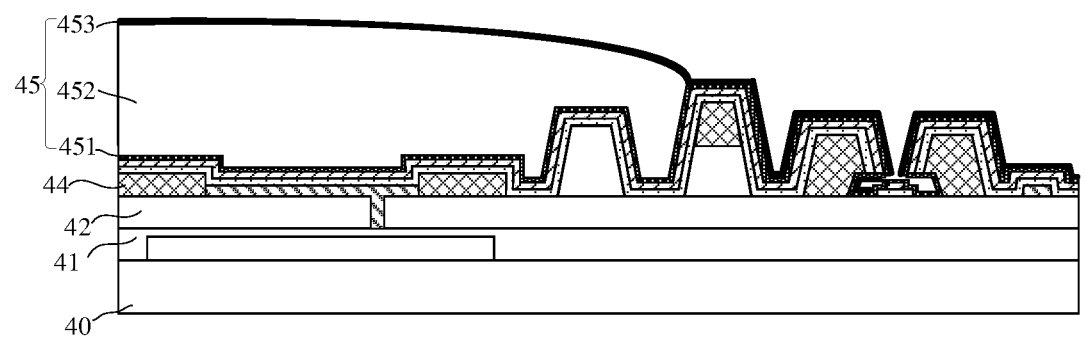

In step S108, the encapsulating layer 45 is formed on the base substrate 40. As shown in FIG. 11H, the first encapsulating sub-layer 451 is formed through a deposition process such as PECVD, etc.; the second encapsulating sub-layer 452 is formed through an ink-jet printing process on the side of the first encapsulating sub-layer 451 away from the base substrate 40; and the third encapsulating sub-layer 453 is formed through a deposition process such as PECVD, etc. The first encapsulating sub-layer 451 and the third encapsulating sub-layer 453 are not disconnected at the undercuts of the eave structure 5 due to the characteristics of the deposition process such as PECVD, etc. In this way, the first encapsulating sub-layer 451 and the third encapsulating sub-layer 453 cover all the eave structures 5, and they may extend from the region of the OLED element 43 to the cutting surface of the aperture 33, thereby the encapsulation dependence is improved.

In step S109, the aperture 33 is formed in the region surrounded by the positioning structure 6. As shown in FIG. 4A, the aperture 33 may penetrate the base substrate 40 and various film layers on the base substrate 40 in the region surrounded by the positioning structure 6, and the film layers comprise but are not limited to the first encapsulating sub-layer 451 and the third encapsulating sub-layer 453, etc. For example, the aperture 33 may be formed through cutting by a laser processing method. As the positioning structure 6 may reflect laser to an extent, in particular, Ag in the positioning structure 6 may reflect laser. In this way, even the laser processing device has a certain cutting deviation, it is still possible to avoid laser cutting the region on the side of the positioning structure 6 away from the aperture 33, thereby avoiding the encapsulation failure problem that may otherwise occur. Also, both the eave structure 5 and the positioning structure 6 are protruded structures disposed surrounding the aperture 33, and it is less possible for the cracks which may be formed when cutting the aperture to extend towards the interior of the display substrate, thereby the encapsulation dependence is further improved.

Optionally, between step S108 and S109, the first planarization layer 46 may also be formed on the side of the eave structure 5 and the positioning structure 6 away from the base substrate 40. For example, the first planarization layer 46 may be formed through an ink-jet printing process (that is, IJP), a coating process, etc. In this way, the material forming the first planarization layer 46 may be prevented from flowing into the aperture 33 since it may be blocked by the eave structure 5 and the positioning structure 6.

It should be noted that, only the manufacturing method of the display substrate in the embodiments shown in FIG. 4A-FIG. 5 are described in detail above, those skilled in the art should understand that the manufacturing method of the display substrate in the embodiments shown in FIGS. 6-9 is similar to this, which will not be repeated here.

It should be understood that, the above manufacturing method provided by the embodiments of the present disclosures should have the same characteristics and advantages as the display substrate provided by the embodiments of the present disclosures, thus, the characteristics and advantages of the above manufacturing method provided by the embodiments of the present disclosures may refer to the characteristics and advantages of the display substrate described above, which will not be repeated here.

Figure 12:
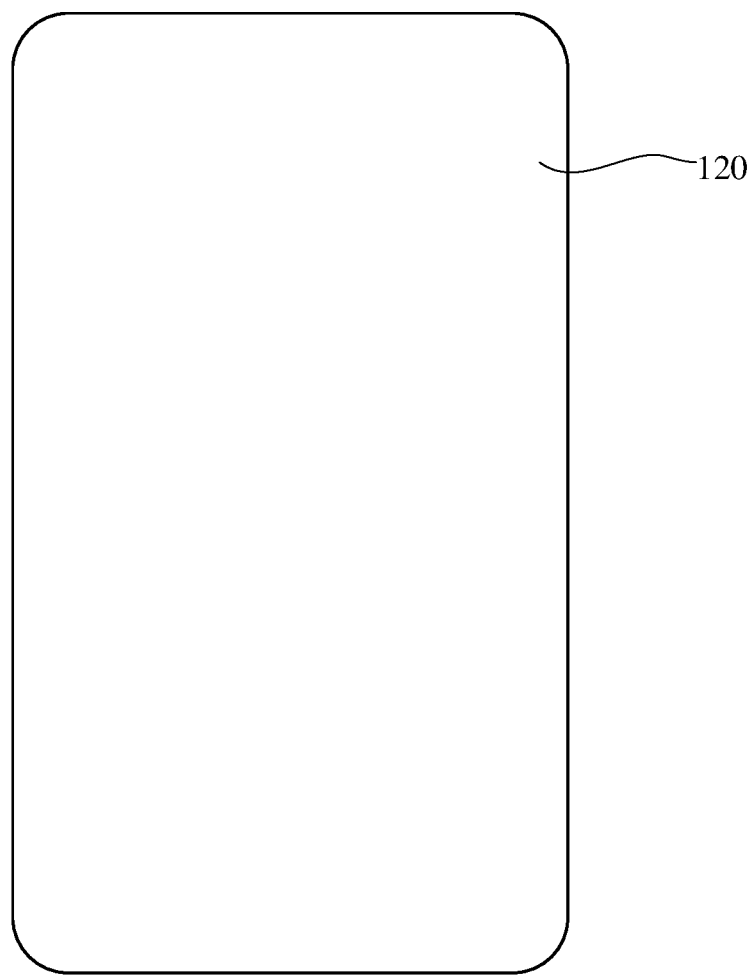
FIG. 12 is a schematic plan view of the electroluminescent display apparatus according to some exemplary embodiments of the present disclosure.

Further, the embodiments of the present disclosure also provide a display apparatus, comprising the electroluminescent display substrate provided by the embodiments described above, as shown in FIG. 12, the plan view of the display apparatus according to the embodiments of the present disclosures is shown. The display apparatus 120 may comprise the display substrate according to any one of the previous embodiments, in particular, it may be a display apparatus providing with at least one aperture. For example, the display apparatus may be any product or component with a display function, for example a smart phone, a wearable smart watch, smart glasses, a tablet, a television, a display, a laptop, a digital photo frame, a navigator, a car monitor, an e-book, etc.

Although some embodiments according to the general concept of the present disclosure have been illustrated and described, those skilled in the art will understand that changes may be made to these embodiments without departing from the principle and spirit of the general concept of the present disclosure, thus the scope of the present disclosure shall be defined by the claims and their equivalents.

What is claimed is:

1. An electroluminescent display substrate, comprising:
a base substrate;
an electroluminescent element on the base substrate, the electroluminescent element comprising a first electrode layer, a light-emitting layer and a second electrode layer which are disposed on the base substrate in sequence;
an encapsulating layer disposed on the base substrate and covering the electroluminescent element;
an aperture, the aperture at least penetrating the encapsulating layer; and
at least one eave structure on the base substrate, the at least one eave structure surrounding the aperture and being located between the aperture and the electroluminescent element,
wherein each eave structure comprises at least one undercut at one end of the eave structure close to the base substrate, and at least one of the light-emitting layer and the second electrode layer is disconnected at the at least one undercut.

2. The electroluminescent display substrate according to claim 1, wherein each eave structure comprises a first side close to the aperture and a second side away from the aperture, and the at least one undercut comprises at least one of a first undercut in the first side and a second undercut in the second side.

3. The electroluminescent display substrate according to claim 2, wherein the at least one eave structure comprises a plurality of eave structures disposed at intervals.

4. The electroluminescent display substrate according to claim 1, wherein both the light-emitting layer and the second electrode layer are disconnected at the at least one undercut.

5. The electroluminescent display substrate according to claim 2, wherein the first undercut extends from the first side towards the second side, a wall of the first undercut away from the aperture constitutes a third side of the eave structure provided with the first undercut, and the first side protrudes relative to the third side in a direction from the electroluminescent element to the aperture, so that at least one of the light-emitting layer and the second electrode layer is disconnected at the first undercut.

6. The electroluminescent display substrate according to claim 5, wherein the second undercut extends from the second side towards the first side, a wall of the second undercut close to the aperture constitutes a fourth side of the eave structure provided with the second undercut, the second side protrudes relative to the fourth side in a direction from the aperture to the electroluminescent element, so that at least one of the light-emitting layer and the second electrode layer is disconnected at the second undercut.

7. The electroluminescent display substrate according to claim 2, wherein the at least one eave structure comprises a first eave structure and a second eave structure, the first eave structure and the second eave structure being disposed in sequence in a direction from the aperture to the electroluminescent element,
the first eave structure comprises a second undercut on the second side of the first eave structure,
the second eave structure comprises a first undercut on the first side of the second eave structure, and
at least one of the light-emitting layer and the second electrode layer is disconnected at both the second undercut of the first eave structure and the first undercut of the second eave structure.

8. The electroluminescent display substrate according to claim 2, wherein the at least one eave structure comprises a first eave structure, a second eave structure, a third eave structure and a fourth eave structure, the first eave structure, the second eave structure, the third eave structure and the fourth eave structure are disposed in sequence in a direction from the aperture to the electroluminescent element, the first eave structure comprises a second undercut on the second side of the first eave structure, the second eave structure comprises a first undercut on the first side of the second eave structure and a second undercut on the second side of the second eave structure, the third eave structure comprises a first undercut on the first side of the third eave structure and a second undercut on the second side of the third eave structure, the fourth eave structure comprises a first undercut in the first side of the fourth eave structure, and at least one of the light-emitting layer and the second electrode layer is disconnected at all of the second undercut of the first eave structure, the first undercut and the second undercut of the second eave structure, the first undercut and the second undercut of the third eave structure, and the first undercut of the fourth eave structure.

9. The electroluminescent display substrate according to claim 2, wherein the at least one eave structure comprises a first eave structure and a second eave structure, the first eave structure and the second eave structure are disposed in sequence in a direction from the aperture to the electroluminescent element, the first eave structure comprises a first undercut on the first side of the first eave structure, the second eave structure comprises a first undercut on the first side of the second eave structure, and at least one of the light-emitting layer and the second electrode layer is disconnected at both the first undercut of the first eave structure and the first undercut of the second eave structure.

10. The electroluminescent display substrate according to claim 2, wherein the at least one eave structure comprises a first eave structure and a second eave structure, the first eave structure and the second eave structure are disposed in sequence in a direction from the aperture to the electroluminescent element, the first eave structure comprises a second undercut on the second side of the first eave structure, the second eave structure comprises a second undercut on the second side of the second eave structure, and at least one of the light-emitting layer and the second electrode layer is disconnected at both the second undercut of the first eave structure and the second undercut of the second eave structure.

11. The electroluminescent display substrate according to claim 1, further comprising:

at least one positioning structure on the base substrate, the at least one positioning structure surrounding the aperture and being located between the aperture and the at least one eave structure, wherein the positioning structure and the first electrode layer are on the same layer.

12. The electroluminescent display substrate according to claim 1, further comprising a pixel define layer, wherein the at least one eave structure and the pixel define layer are on the same layer.

13. The electroluminescent display substrate according to claim 1, wherein a height of the at least one undercut in a direction perpendicular to the base substrate is larger than a thickness of the first electrode layer in the direction perpendicular to the base substrate.

14. The electroluminescent display substrate according to claim 10, wherein the encapsulating layer comprises a first encapsulating sub-layer, a second encapsulating sub-layer and a third encapsulating sub-layer provided in sequence in a direction away from the base substrate, the first encapsulating sub-layer and the third encapsulating sub-layer are made of inorganic material, the second encapsulating sub-layer is made of organic material, and the first encapsulating sub-layer and the third encapsulating sub-layer cover all sides of each eave structure and the positioning structure.

15. The electroluminescent display substrate according to claim 3, further comprising:

a first planarization layer on a side of the third encapsulating sub-layer away from the base substrate, wherein the first planarization layer fills the at least one undercut and the intervals between any two ones of the plurality of eave structures.

16. An electroluminescent display apparatus, comprising the electroluminescent display substrate according to claim 1.

17. A method of manufacturing an electroluminescent display substrate, wherein the electroluminescent display substrate comprises:

a base substrate;

an electroluminescent element on the base substrate, the electroluminescent element comprising a first electrode layer, a light-emitting layer and a second electrode layer which are disposed on the base substrate in sequence;

an encapsulating layer disposed on the base substrate and covering the electroluminescent element;

an aperture, the aperture at least penetrating the encapsulating layer; and at least one eave structure on the base substrate, the at least one eave structure surrounding the aperture and being located between the aperture and the electroluminescent element, wherein each eave structure comprises at least one undercut at one end of the eave structure close to the base substrate, and at least one of the light-emitting layer and the second electrode layer is disconnected at the at least one undercut; and the method comprising:

forming a first electrode layer on a base substrate;

forming at least one placeholder structure on the base substrate;

forming a pixel define material layer on the base substrate, and forming a structure covering at least one side of each placeholder structure through a patterning process;

etching off the placeholder structure through a wet-etching process, so that the structure covering at least one side of each placeholder structure forms an eave structure, the eave structure comprising at least one undercut at one end of the eave structure close to the base substrate;

forming a light-emitting layer and a second electrode layer on the base substrate through an evaporation process, so that at least one of the light-emitting layer and the second electrode layer is disconnected at the at least one undercut;

forming an encapsulating layer on a side of the second electrode layer away from the base substrate; and forming an aperture in an area surrounded by the eave structure, the aperture at least penetrating the encapsulating layer.

18. The method according to claim 17, wherein an etching solution used in the wet-etching process has different etching rates between a material of the placeholder structure and a material of the first electrode layer.

19. The method according to claim 18, wherein the material of the placeholder structure comprises IZO or IGZO, and the material of the first electrode layer comprises ITO.

20. The method according to claim 17, wherein the step of forming the first electrode layer on the base substrate comprises:
    through the same one patterning process, forming the first electrode layer and at least one positioning structure on the base substrate, the at least one positioning structure surrounding an area in which the aperture is to be formed.

* * * * *